United States Patent
Imai

(10) Patent No.: US 7,181,714 B2
(45) Date of Patent: Feb. 20, 2007

(54) SCHEDULER, METHOD AND PROGRAM FOR SCHEDULING, AND APPARATUS FOR HIGH-LEVEL SYNTHESIS

(75) Inventor: Hiroshi Imai, Hatogaya (JP)

(73) Assignee: Kabushiki Kaisha Toshiba (JP)

( * ) Notice: Subject to any disclaimer, the term of this patent is extended or adjusted under 35 U.S.C. 154(b) by 146 days.

(21) Appl. No.: 10/887,801

(22) Filed: Jul. 9, 2004

(65) Prior Publication Data

US 2005/0144581 A1    Jun. 30, 2005

(30) Foreign Application Priority Data

Dec. 24, 2003  (JP) ............................. P2004-427452

(51) Int. Cl.
*G06F 17/50*  (2006.01)
(52) U.S. Cl. .............................. 716/7; 716/8
(58) Field of Classification Search ............... 716/7–10
See application file for complete search history.

(56) References Cited

U.S. PATENT DOCUMENTS

| | | | |
|---|---|---|---|
| 5,933,356 A * | 8/1999 | Rostoker et al. .............. 703/15 |
| 6,449,763 B1 * | 9/2002 | Yamada et al. ................ 716/18 |
| 6,493,863 B1 * | 12/2002 | Hamada et al. ............... 716/18 |
| 6,904,577 B2 * | 6/2005 | Schubert et al. ................ 716/4 |
| 6,925,628 B2 * | 8/2005 | Ogawa et al. ................. 716/18 |
| 2003/0121010 A1 * | 6/2003 | Aubury .......................... 716/4 |

FOREIGN PATENT DOCUMENTS

JP    05-101141    4/1993

OTHER PUBLICATIONS

Daniel D. Gajski, Nikil D. Dutt, Allen C-H Wu, and Steve Y-L Lin, "High-Level Synthesis Introduction to Chip and System Design", Kluwer Academic Publishers, 1992, pp. 213-255.

* cited by examiner

*Primary Examiner*—Jack Chiang
*Assistant Examiner*—Binh Tat
(74) *Attorney, Agent, or Firm*—Kilpatrick Stockton LLP

(57) ABSTRACT

A scheduler includes: a schedule information acquisition section configured to acquire the number of first clock cycles and the number of second clock cycles as schedule information of a function belonging to a lower-hierarchy, the number of the first clock cycles being the number of clock cycles after an execution of the function is started until an input data of the function is used, the number of the second clock cycles being the number of clock cycles after an output data of the function is outputted until the execution of the function is completed; and a scheduling processing section configured to obtain operations executable in the first clock cycles and operations executable in the second clock cycles from among operations belonging to an upper-hierarchy for calling the function, based on the acquired schedule information, and to schedule the upper-hierarchy ensure that the obtained operations execute in parallel with the function.

18 Claims, 18 Drawing Sheets

| SCHEDULE INFORMATION | INPUT1 | INPUT2 | ... | OUTPUT1 | OUTPUT2 | ... |
|---|---|---|---|---|---|---|
| | $M_1$ | $M_2$ | ... | $N_1$ | $N_2$ | ... |
| VALUES | 2 | 3 | ... | 2 | 1 | ... |

FIG. 9

```
V = {ALL OPERATIONS vi}                                          S601
for (EACH OPERATIONS vi ∈ SET V) {                               S602
    if (vi HAS NO PARENT OPERATION){                             S603
        Si = 1                                                   S604
        V = V - {vi}                                             S605
    } else {                                                     S606
        Si = 0                                                   S607
    }                                                            S608
}                                                                S609
while (V≠∅) {                                                    S610
    for (EACH OPERATIONS vi ∈ SET V) {                           S611
        if (ALL PARENT OPERATIONS vj OF vi ARE SCHEDULED) {      S612
            for (EACH PARENT OPERATIONS vj) {                    S613
                if (vj IS OPERATION FOR CALLING FUNCTION)        S614
                    Tj = Sj - Nj                                 S615
                else                                             S616
                    Tj = Sj                                      S617
                T = T + {Tj}                                     S618
            }                                                    S619
            if (vi IS OPERATION FOR CALLING FUNCTION)            S620
                Si = MAX_T(Tj - Mj) + 1                          S621
            else                                                 S622
                Si = MAX_T(Tj) + 1                               S623
            V = V - {vi}                                         S624
        }                                                        S625
    }                                                            S626
}                                                                S627
```

FIG. 13

```
V = {ALL OPERATIONS vi}                                         S901
for (EACH OPERATIONS vi ∈ SET V) {                              S902
    if (vi HAS NO PARENT OPERATION) {                           S903
        Si = 1                                                  S904
        V = V - {vi}                                            S905
    } else {                                                    S906
        Si = 0                                                  S907
    }                                                           S908
}                                                               S909
while (V ≠ ∅) {                                                 S910
    for (EACH OPERATIONS vi ∈ SET V) {                          S911
        if (ALL PARENT OPERATIONS vj OF vi ARE SCHEDULED) {     S912
            Si = MAX(Sj) + 1                                    S913
            V = V - {vi}                                        S914
        }                                                       S915
    }                                                           S916
}                                                               S917
V = {ALL INPUT OPERATIONS vi}                                   S918
for (EACH OPERATIONS vi ∈ SET V) {                              S919
    for (EACH CHILD OPERATIONS vj) {                            S920
        Tj = Sj                                                 S921
        T = T + {Tj}                                            S922
    }                                                           S923
    Si = MAXT (Tj) - 1                                          S924
}                                                               S925
```

FIG. 18
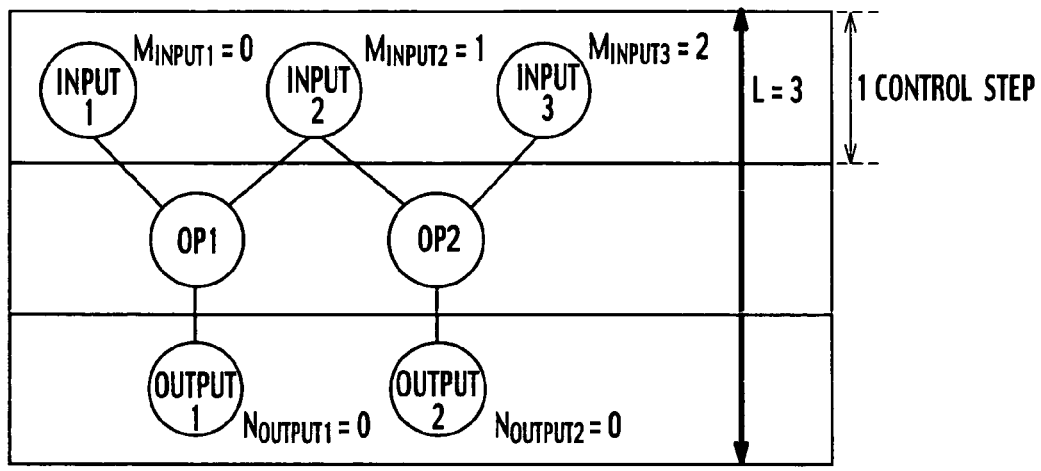
FIG. 19
| SCHEDULING RESULT \ VALUES | L | $M_{INPUT1}$ | $M_{INPUT2}$ | $M_{INPUT3}$ | $N_{OUTPUT1}$ | $N_{OUTPUT2}$ |
|---|---|---|---|---|---|---|
| SCHEDULING - 1 | 5 | 0 | 1 | 2 | 1 | 0 |
| SCHEDULING - 2 | 3 | 0 | 0 | 0 | 0 | 0 |
FIG. 20
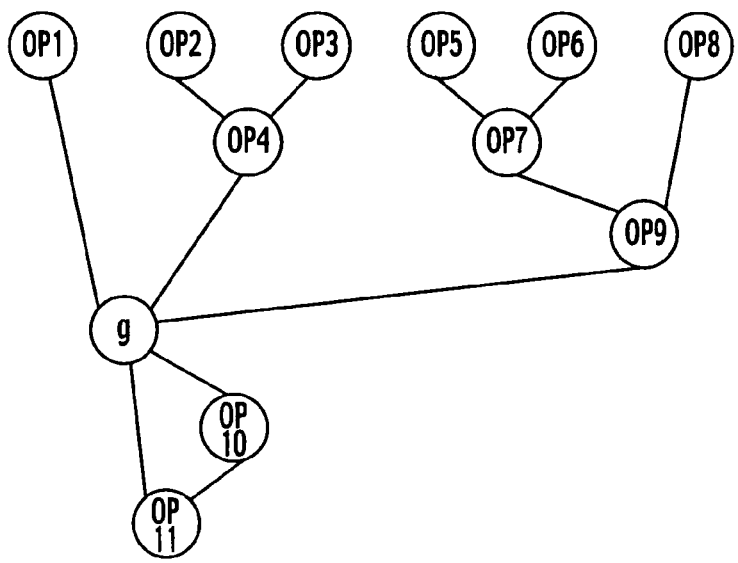

| FUNCTIONS \ VALUES | L | $M_{INPUT1}$ | $M_{INPUT2}$ | $N_{OUTPUT1}$ | $N_{OUTPUT2}$ |
|---|---|---|---|---|---|
| f | 4 | 0 | 1 | 1 | 0 |
| g | 3 | 0 |  | 0 |  |

SCHEDULER, METHOD AND PROGRAM FOR SCHEDULING, AND APPARATUS FOR HIGH-LEVEL SYNTHESIS

CROSS REFERENCE TO RELATED APPLICATIONS

This application claims benefit of priority under 35 USC §119 to Japanese Patent Application No. 2003-427452 filed on Dec. 24, 2003, the entire contents of which are incorporated by reference herein.

BACKGROUND OF THE INVENTION

1. Field of the Invention

The present invention pertains to a scheduler, a scheduling method, a scheduling program and a high-level synthesis apparatus for automatically synthesizing a logic circuit from behavioral descriptions.

2. Description of the Related Art

The scale of a system which can be mounted on one chip has increased as semiconductor technology develops. For this reason, a high-level synthesis methodology as a means for designing a large-scale system in a short period of time is disclosed in "HIGH-LEVEL SYNTHESIS Introduction to Chip and System Design", Daniel D. Gajski et al., Kluwer Academic Publishers, 1992, and is further disclosed in Japanese patent Laid Open Publication (Kokai) No. H05-101141. The high-level synthesis methodology synthesizes Register Transfer Level (RTL) descriptions including hardware information, such as clock cycles, a register, an arithmetic unit and the like, from behavioral descriptions describing only operations of the system.

In the high-level synthesis, the process for partitioning the analyzed behavioral descriptions into groups to execute in each clock cycle (cycle of operation) is called "scheduling", and each clock cycle is called "control step".

The behavioral descriptions may have a hierarchical structure depending on the design. For example, behavioral descriptions described by using C programming language may have a hierarchical structure including function calls. In this case, the side for calling functions belongs an upper-hierarchy, and the called functions belong a lower-hierarchy.

In the conventional scheduling method, each operation described in the behavioral descriptions is assigned to any control step only based on a delay value and the number of the control steps required for execution of the operation. Therefore, the operation to be scheduled is scheduled into a control step after a control step in which an operation calculating input data of the operation to be scheduled was scheduled. Furthermore, an operation using output data of the operation to be scheduled will be scheduled into a control step after the control step in which the operation to be scheduled is scheduled.

The function belonging to the lower-hierarchy is similarly scheduled only based on a delay and the number of the control steps required for execution of the function. Therefore, the function is scheduled so that: execution of the function belonging to the lower-hierarchy is started after all input data to pass to the function belonging to the lower-hierarchy is available; and output data from the function can be used in the upper-hierarchy after execution of the function belonging to the lower-hierarchy is perfectly completed.

In the above scheduling method, since it was not enough considered that the fact of the matter is that parallel execution is possible between the upper-hierarchy and the lower-hierarchy, there was a problem that the optimum scheduling is impossible.

Similarly, in the case that two or more functions belonging to the lower-hierarchy are called from the upper-hierarchy side, it was also not enough considered that the fact of the matter is that each function belonging to the lower-layer is executable in parallel. Therefore, there was also a problem that it is scheduled in series so that execution of the function called second is started after execution of the function called first is completed.

Moreover, in the conventional scheduling method by in-lining the behavioral descriptions of the lower-hierarchy into the behavioral descriptions of the upper-hierarchy, there was the constraint that the behavioral descriptions of the lower-hierarchy had to be prepared beforehand. Therefore, there was also a problem that design was not fully reusable.

SUMMARY OF THE INVENTION

A scheduler for partitioning behavioral operations of a logic circuit under design into groups executed in each clock cycle, the behavioral operations with a hierarchical structure being described in behavioral descriptions, the scheduler according to an embodiment of the present invention includes: a schedule information acquisition section configured to acquire the number of first clock cycles and the number of second clock cycles as schedule information of a function belonging to a lower-hierarchy described in the behavioral descriptions, the number of the first clock cycles being the number of clock cycles after an execution of the function is started until an input data of the function is used in the function, the number of the second clock cycles being the number of clock cycles after an output data of the function is outputted until the execution of the function is completed; and a scheduling processing section configured to obtain operations executable in the first clock cycles and operations executable in the second clock cycles from among operations belonging to an upper-hierarchy calling the function, based on the acquired schedule information, the scheduling processing section further configured to schedule the upper-hierarchy in order that the obtained operations execute in parallel with the function.

A computer executable program for partitioning behavioral operations of a logic circuit under design into groups executed in each clock cycle, the behavioral operations with a hierarchical structure being described in behavioral descriptions, the computer executable program according to an embodiment of the present invention includes: acquiring the number of first clock cycles and the number of second clock cycles as schedule information of a function belonging to a lower-hierarchy described in the behavioral descriptions, the number of the first clock cycles being the number of clock cycles after an execution of the function is started until an input data of the function is used in the function, the number of the second clock cycles being the number of clock cycles after an output data of the function is outputted until the processing of the function is completed; obtaining operations executable in the first clock cycles and operations executable in the second clock cycles from among operations belonging to an upper-hierarchy calling the function, based on the acquired schedule information; and scheduling the upper-hierarchy in order that the obtained operations execute in parallel with the function.

An apparatus for high-level synthesis according to an embodiment of the present invention includes: a behavioral description analyzer configured to analyze behavioral descriptions describing behavioral operations of a logic circuit under design and to generate a data-flow graph; scheduler configured to partition behavioral operations in the data-flow graph into groups executed in each clock cycle; a circuit element allocator configured to allocate each behavioral operation already scheduled of the data-flow graph to each circuit element of the logic circuit; and an RTL description generator configured to generate register transfer level descriptions based on an allocation results of the circuit elements. The scheduler includes: a schedule information acquisition section configured to acquire the number of first clock cycles and the number of second clock cycles as schedule information of a function belonging to a lower-hierarchy described in the data-flow graph, the number of the first clock cycles being the number of clock cycles after an execution of the function is started until an input data of the function is used in the function, the number of the second clock cycles being the number of clock cycles after an output data of the function is outputted until the execution of the function is completed; and a scheduling processing section configured to obtain operations executable in the first clock cycles and operations executable in the second clock cycles from among operations belonging to an upper-hierarchy calling the function, based on the acquired schedule information, the scheduling processing section further configured to schedule the upper-hierarchy in order that the obtained operations execute in parallel with the function.

BRIEF DESCRIPTION OF THE DRAWINGS

FIG. 9 is an illustration showing the scheduling algorithm shown in FIG. 8 described by using a programming language such like C language.

FIG. 13 is an illustration showing the scheduling algorithm shown in FIG. 12 described by using the programming language such like C language.

FIG. 18 is an illustration showing an example of second scheduling results (SCHEDULING 2) among two or more kinds of scheduling results in the third embodiment.

FIG. 19 is an illustration showing an example of schedule information extracted from the scheduling results shown in FIGS. 17 and 18.

FIG. 20 is a data-flow graph (DFG) showing an example of behavioral descriptions to be scheduled according to the third embodiment.

DETAILED DESCRIPTION

Figure 1:
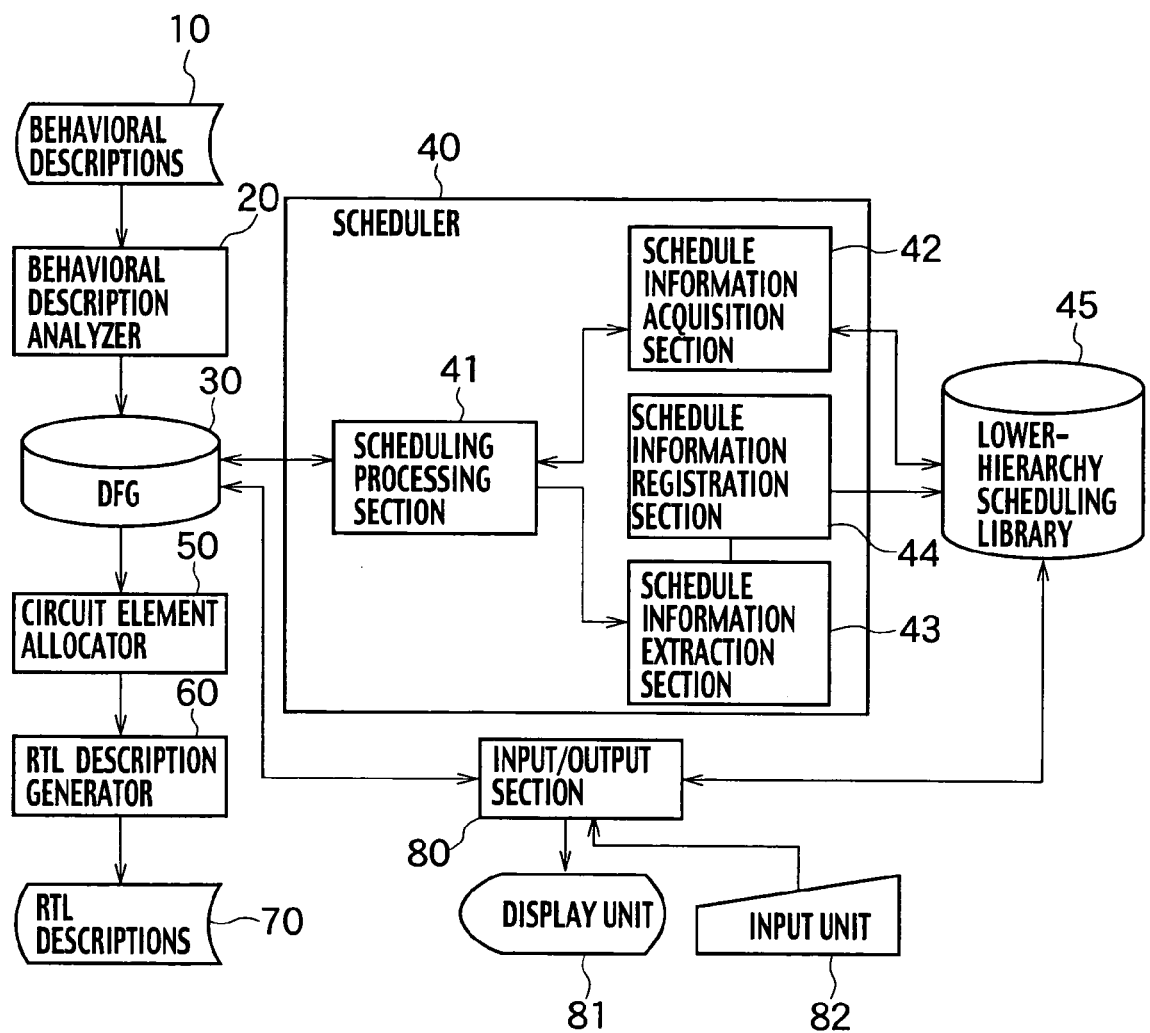
FIG. 1 is a simplified block diagram showing an example of a configuration of an apparatus for high-level synthesis according to an embodiment of the present invention.

Various embodiments of the present invention will be described herein below with reference to the accompanying drawings. It is to be noted that the same or similar reference numerals are applied to the same or similar parts and elements throughout the drawings, and the description of the same or similar parts and elements will be omitted or simplified.

Components of High-Level Synthesis Apparatus and Scheduler

An apparatus for high-level synthesis according to the present embodiment is a design apparatus for synthesizing Register Transfer Level (RTL) descriptions including hardware information, such as clock cycles, a register, an arithmetic unit and the like, from behavioral descriptions describing only operations of the circuit system. The apparatus is, for example, implemented by a computer system having a central processing unit, a memory storage, an input unit, an output unit, and the like.

As shown in FIG. 1, the high-level synthesis apparatus includes a behavioral description analyzer 20, a scheduler 40, a circuit element allocator 50, an RTL description generator 60, an input/output section 80 and the like.

The behavioral description analyzer 20 analyzes behavioral descriptions 10 describing only behavioral operations of a logic circuit under design, and then generates a data-flow graph (DFG) 30. The behavioral descriptions 10 are described by using a programming language, such as C language, C++ language and the like. The behavioral description analyzer 20 compiles and analyzes the behavioral descriptions 10, and then generates the DFG 30 representing dependent relations of operations in the behavioral descriptions 10 based on a result of the analysis.

The scheduler 40 includes a scheduling processing section 41, a schedule information acquisition section 42, a schedule information extraction section 43, a schedule information registration section 44. The scheduler 40 performs a scheduling processing for partitioning each operation of the DFG 30 into groups executed in each clock cycle.

The schedule information acquisition section 42 acquires the number of first clock cycles and the number of second clock cycles as schedule information of a function from a lower-hierarchy scheduling library 45. The number of the first clock cycles is the number of clock cycles after an execution of the function belonging to the lower-hierarchy is started until an input data of the function is used in the function. The number of the second clock cycles is the number of clock cycles after an output data of the function is outputted until the execution of the function is completed.

The scheduling processing section 41 obtains operations executable in the first clock cycles and operations executable in the second clock cycles from among operations belonging to an upper-hierarchy calling the function belonging to the lower-hierarchy, based on the schedule information of the function belonging to the lower-hierarchy acquired by the schedule information acquisition section 42. The scheduling processing section 41 then optimizes a scheduling of the upper-hierarchy in order that the obtained operations execute in parallel with the function belonging to the lower-hierarchy. Furthermore, in the case of scheduling of the function belonging to the lower-hierarchy, the scheduling processing section 41 optimizes the schedule of the lower-hierarchy in order that: an operation for inputting data to the function to be scheduled is assigned to immediately before an operation using the input data in the function; and an operation for outputting data from the function to be scheduled is assigned to immediately after an operation calculating the output data in the function.

Furthermore, in the case where two or more schedule information of the function belonging to the lower-hierarchy are stored in the lower-hierarchy scheduling library 45, the scheduling processing section 41 performs a scheduling processing by using the two or more schedule information acquired by the schedule information acquisition section 42, according to the logical circuit under design.

Moreover, in the case where two or more functions are successively called by the behavioral descriptions of the upper-hierarchy, the scheduling processing section 41 obtains operations executable in the second clock cycles of the preceding function among the two or more functions, from among operations of the following function, and then optimizes the following function in order that the obtained operations of the following function execute in parallel with the preceding function.

The schedule information extraction section 43 extracts the number of first clock cycles and the number of second clock cycles of the function to be scheduled as the schedule information, from a scheduling result performed by the scheduling processing section 41. The schedule information registration section 44 stores the number of the first clock cycles and the number of the second clock cycles as the schedule information into the lower-hierarchy scheduling library 45.

The circuit element allocator 50 allocates each behavioral operation already scheduled of the DFG 30 to each circuit element of the logic circuit.

The RTL description generator 60 generates Register Transfer Level (RTL) descriptions 70 based on a scheduling result and an allocation result of the circuit elements.

The input/output section 80 displays the scheduled DFG 30, the schedule information stored in the lower-hierarchy scheduling library 45, etc. on the display unit 81, and accepts input data, directions, etc. from the input unit 82.

Processing Operation of High-Level Synthesis

Figure 2:
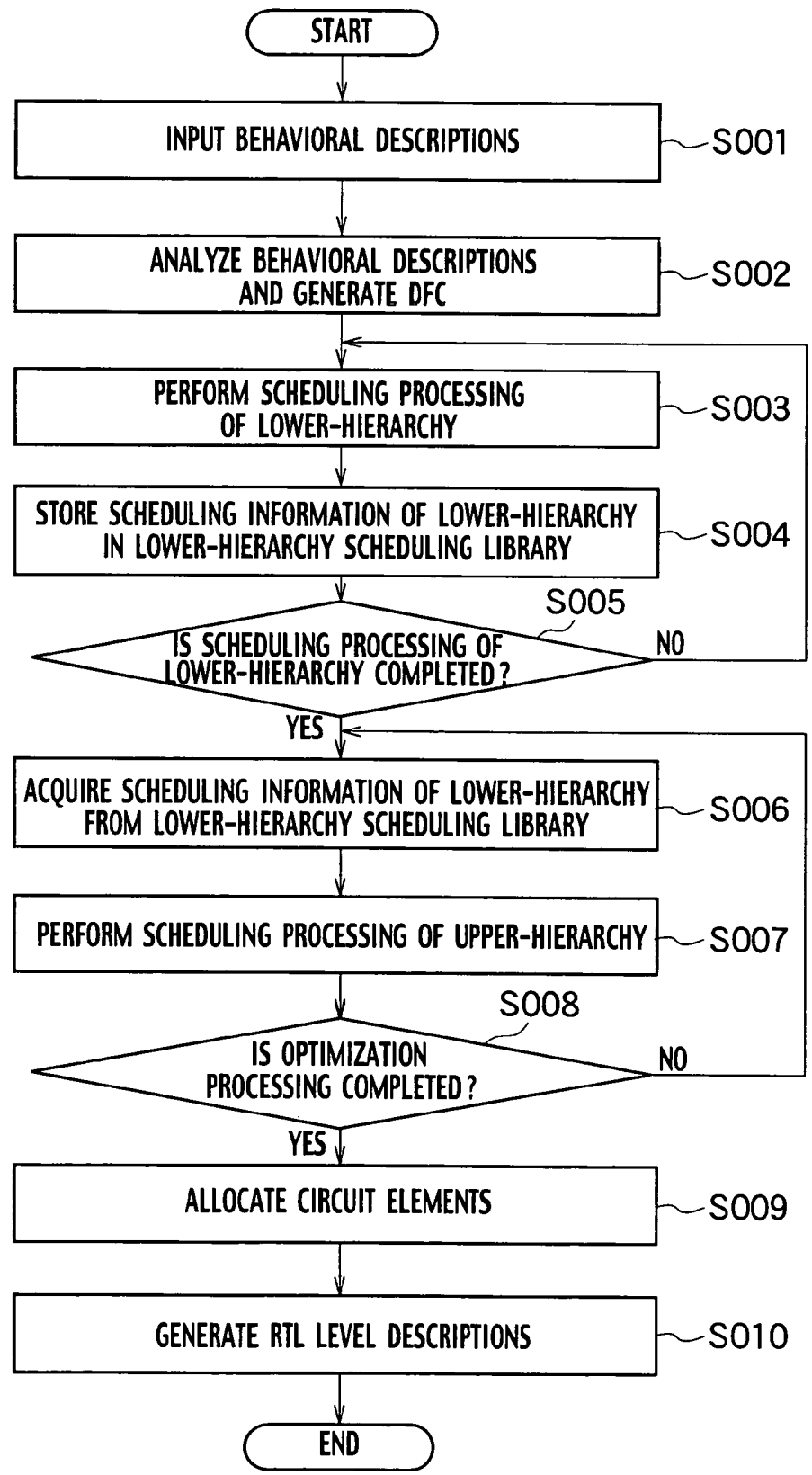
FIG. 2 is a flow chart showing an example of a processing procedure for high-level synthesis performed by the apparatus shown in FIG. 1.

FIG. 2 shows an example of a processing procedure performed by the high-level synthesis apparatus shown in FIG. 1.

In addition, the processing procedure shown in FIG. 2 can be converted to a computer program, and then the high-level synthesis apparatus of the present embodiment implemented by a computer system may be read the computer program stored in a computer-readable recoding medium and may perform each processing described in the computer program.

As shown in FIG. 2, in Step S001, the behavioral description analyzer 20 inputs behavioral descriptions 10. In Step S002, the behavioral description analyzer 20 analyzes the input behavioral descriptions and then generates a DFG 30.

In Step S003, the scheduling processing section 41 schedules a function belonging to a lower-hierarchy in the DFG 30 in order that: an operation for inputting data to the function to be scheduled is assigned to immediately before an operation using the input data in the function; and an operation for outputting data from the function to be scheduled is assigned to immediately after an operation calculating the output data in the function.

In Step S004, the schedule information extraction section 43 extracts the number of first clock cycles and the number of second clock cycles of the function to be scheduled as the schedule information, from a scheduling result performed by the scheduling processing section 41. Furthermore, the schedule information registration section 44 stores the extracted number of the first clock cycles and the extracted number of the second clock cycles as the schedule information into the lower-hierarchy scheduling library 45.

In Step S005, the scheduler 40 determines whether or not the all the functions belonging to the lower-hierarchy are already scheduled. As a result of the determination, if there still remains the function to be scheduled, returning to Step S003, next function belonging to the lower-hierarchy will be scheduled. On the other hand, if all the functions belonging to the lower-hierarchy are already scheduled, this processing goes to Step S006.

In Step S006, the schedule information acquisition section 42 acquires the schedule information of the function belonging to the lower-hierarchy from the lower-hierarchy scheduling library 45.

In Step S007, the scheduling processing section 41 obtains operations executable in the first clock cycles and operations executable in the second clock cycles from among operations belonging to the upper-hierarchy for calling the function, based on the schedule information of the function belonging to the lower-hierarchy acquired by the schedule information acquisition section 42. The scheduling processing section 41 then optimizes a schedule of the upper-hierarchy in order that the obtained operations execute in parallel with the function.

In Step S008, the scheduler 40 determines whether or not the all the scheduling processes of the upper-hierarchy are already completed. As a result of the determination, if there still remains to be scheduled, this processing returns to Step S006. On the other hand, if all the scheduling processes of the upper-hierarchy are already completed, this scheduling processing is ended.

In Step S009, the circuit element allocator 50 allocates each of the already scheduled behavioral operations of the DFG 30 to each circuit element of the logic circuit.

In Step S010, the RTL description generator 60 generates RTL descriptions 70 based on a scheduling result and an allocation result of the circuit elements.

In addition, the schedule information of the upper-hierarchy used by the scheduling processing section 41 in Step S007 is not limited to the schedule information extracted from the scheduling result of the lower-hierarchy by the schedule information extraction section 43. For example, if the RTL descriptions of the function belonging to the lower-hierarchy are already prepared, schedule information may be extracted from the prepared RTL descriptions by the schedule information extraction section 43, and the extracted schedule information may be stored in the lower-hierarchy scheduling library 45 by the schedule information registration section 44. Or schedule information of the function belonging to the lower-hierarchy inputted from the input unit 82 may be stored in the lower-hierarchy scheduling library 45 by the input/output section 80.

Scheduling Processing in First Embodiment

Next, the scheduling processing performed by the scheduler 40 will be explained in detail herein below.

Figure 3:
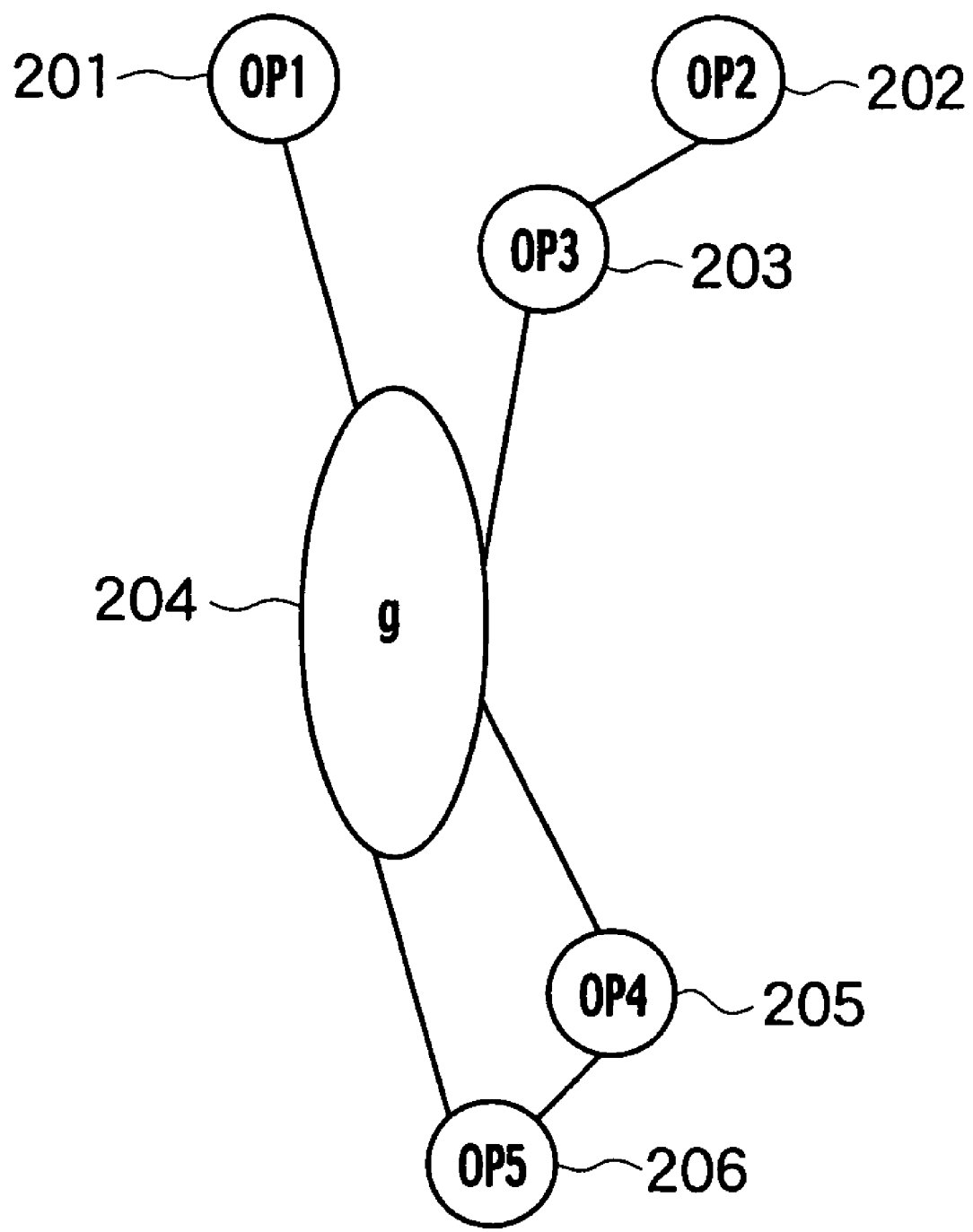
FIG. 3 is a data-flow graph (DFG) showing an example of behavioral descriptions targeted for scheduling according to a first embodiment.

FIG. 3 shows an example of behavioral descriptions to be scheduled expressed graphically by a data flow graph (DFG). In FIG. 3, each of the circular figures expresses an operation; and the operations 201, 202, 203, 205 and 206 express the typical operations, such as an addition or the like. The operation 204 is an operation calling a function "g" belonging to a lower-hierarchy. Each solid line to connect between the circular figures of the operations expresses the data dependency between the operations. For example, the solid line connecting the operation 202 and the operation 203 means that the operation 203 uses an arithmetic result of the operation 202. Therefore, the function "g" belonging to the lower-hierarchy inputs an arithmetic result of the operation 201 and an arithmetic result of the operation 203, and then outputs data used by the operation 205 and the operation 206.

Figure 4:
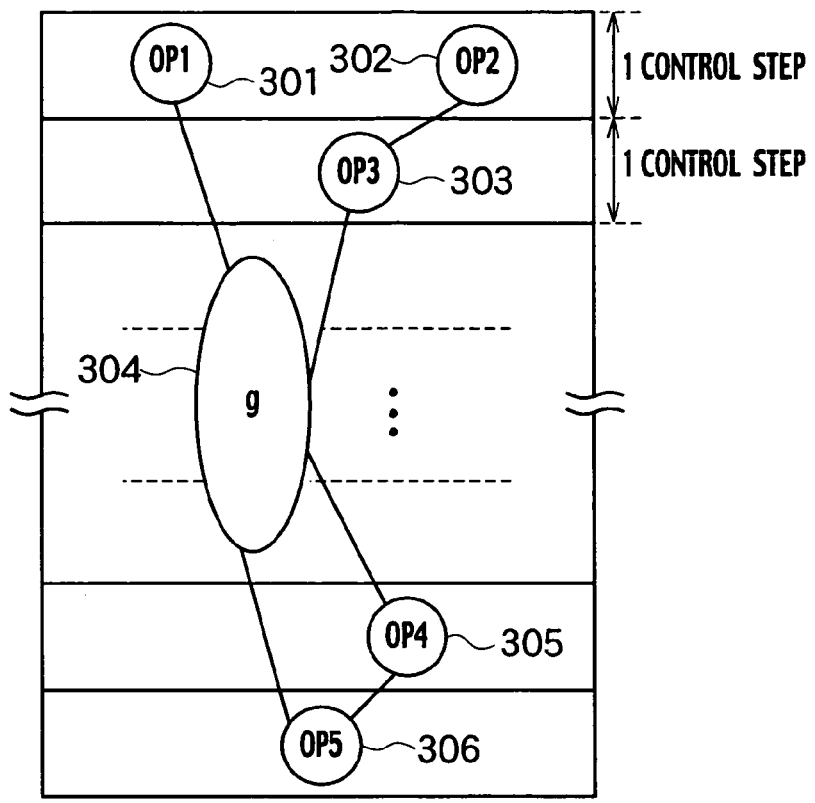
FIG. 4 is an illustration showing an example of scheduling results of the behavioral descriptions shown in FIG. 3 scheduled by using an As Soon As Possible (ASAP) scheduling algorithm.

FIG. 4 shows an example of scheduling results of the behavioral descriptions shown in FIG. 3 scheduled by using the As Soon As Possible (ASAP) scheduling algorithm. The ASAP scheduling algorithm is disclosed in the above-mentioned reference "HIGH-LEVEL SYNTHESIS Introduction to Chip and System Design". The horizontal parallel lines in FIG. 4 express the boundary between clock cycles. The one section partitioned at the parallel lines means 1 control step, and an operation in 1 control step is performed in 1 clock cycle. However, the calling the function "g" expressed as the operation 304 is generally performed for two or more clock cycles. In addition, the parallel dotted lines in FIG. 4 express the boundary between clock cycles for which the function "g" being executed in the lower-hierarchy.

Figure 5:
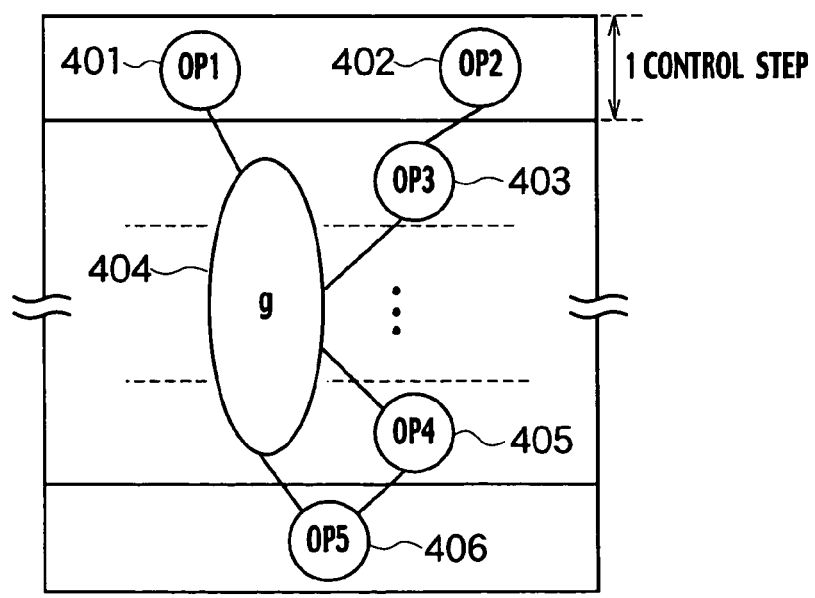
FIG. 5 is an illustration showing an example of scheduling results of the behavioral descriptions shown in FIG. 3 scheduled by a scheduler according to the first embodiment.

In contrast, FIG. 5 shows an example of scheduling results of the behavioral descriptions shown in FIG. 3 scheduled by the scheduler 40 of the present embodiment. It is scheduled in order that the operation 403 and the operation 405 are executed in parallel with the execution of the function "g" belonging to the lower-hierarchy.

Figures 6, 7:
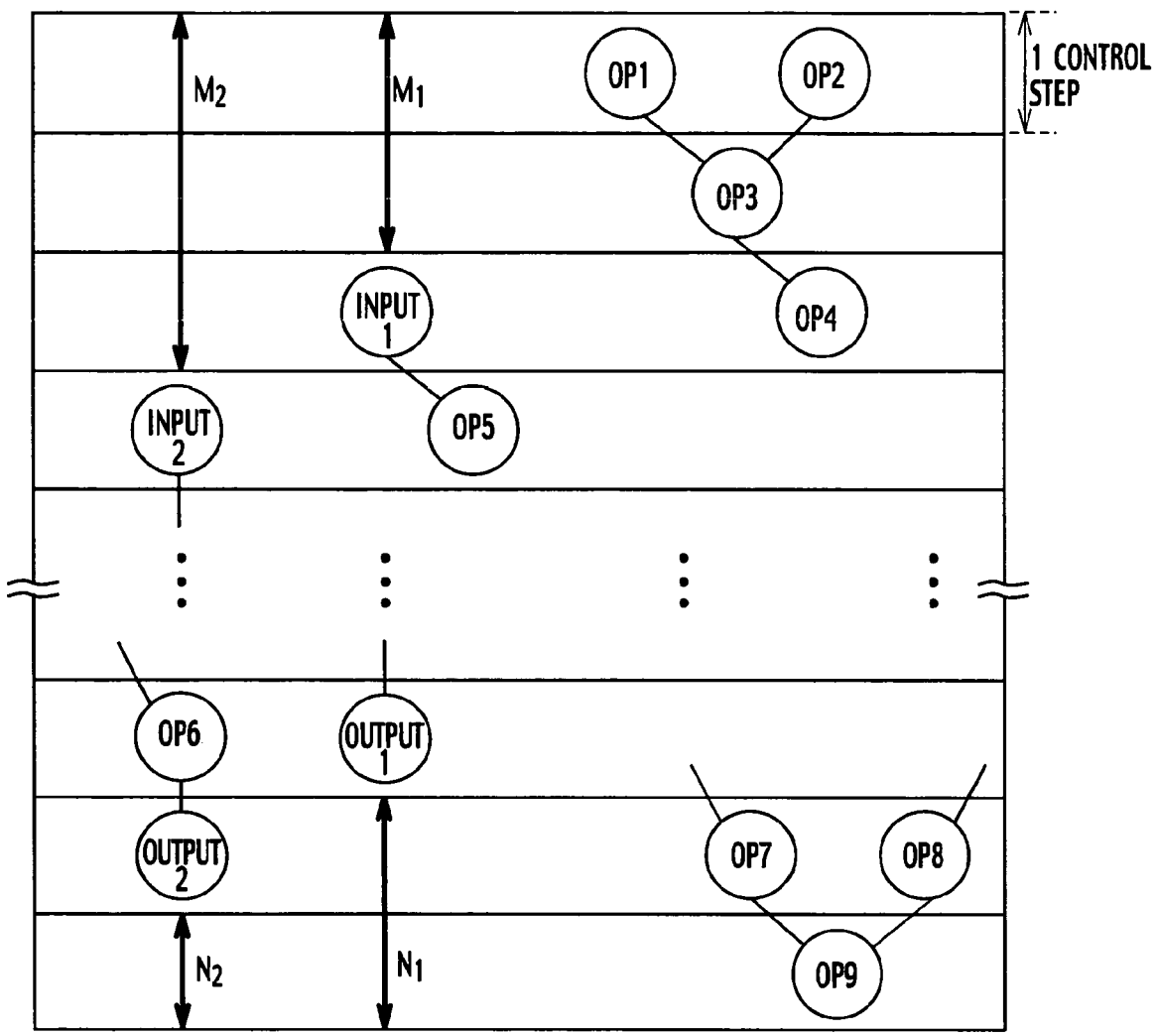
FIG. 6 is an illustration showing an example of schedule information used by the scheduler in order to achieve the scheduling results shown in FIG. 5.
FIG. 7 is an illustration showing an example of the data structure at the time when the schedule information shown in FIG. 6 is stored in a lower-hierarchy scheduling library.

FIGS. 6 and 7 show an example of schedule information used by the scheduler 40 in order to achieve the scheduling results shown in FIG. 5. When a function is executed, the function inputs data from the outside of the function and then outputs a processing result to the outside of the function. In the case where the function requires some kind of initialization before using the input data, for example., when acquiring data through a bus, the function requires a bus arbitration. Thus, the input data is not actually used in the function until several clock cycles after the execution of the function is started. Therefore, the scheduler 40 uses the number of clock cycles (number of first clock cycles) after the execution of the function is started until the input data is used in the function, as the schedule information required for scheduling. In the example shown in FIG. 6, the number of clock cycles $M_1$ is the schedule information (number of first clock cycles) of INPUT1, and the number of clock cycles $M_2$ is the schedule information (number of first clock cycles) of INPUT2.

Furthermore, when outputting results processed in the function to the outside of the function, any processing may continue inside the function after outputting some processing results to the outside of the function. Therefore, the scheduler 40 also uses the number of clock cycles (number of second clock cycles) after the output data of the function is outputted until the processing of the function is completed, as the schedule information required for scheduling. In the example shown in FIG. 6, the number of clock cycles $N_1$ is the schedule information (number of second clock cycles) of OUTPUT1, and the number of clock cycles $N_2$ is the schedule information (number of second clock cycles) of OUTPUT2.

Figure 8:
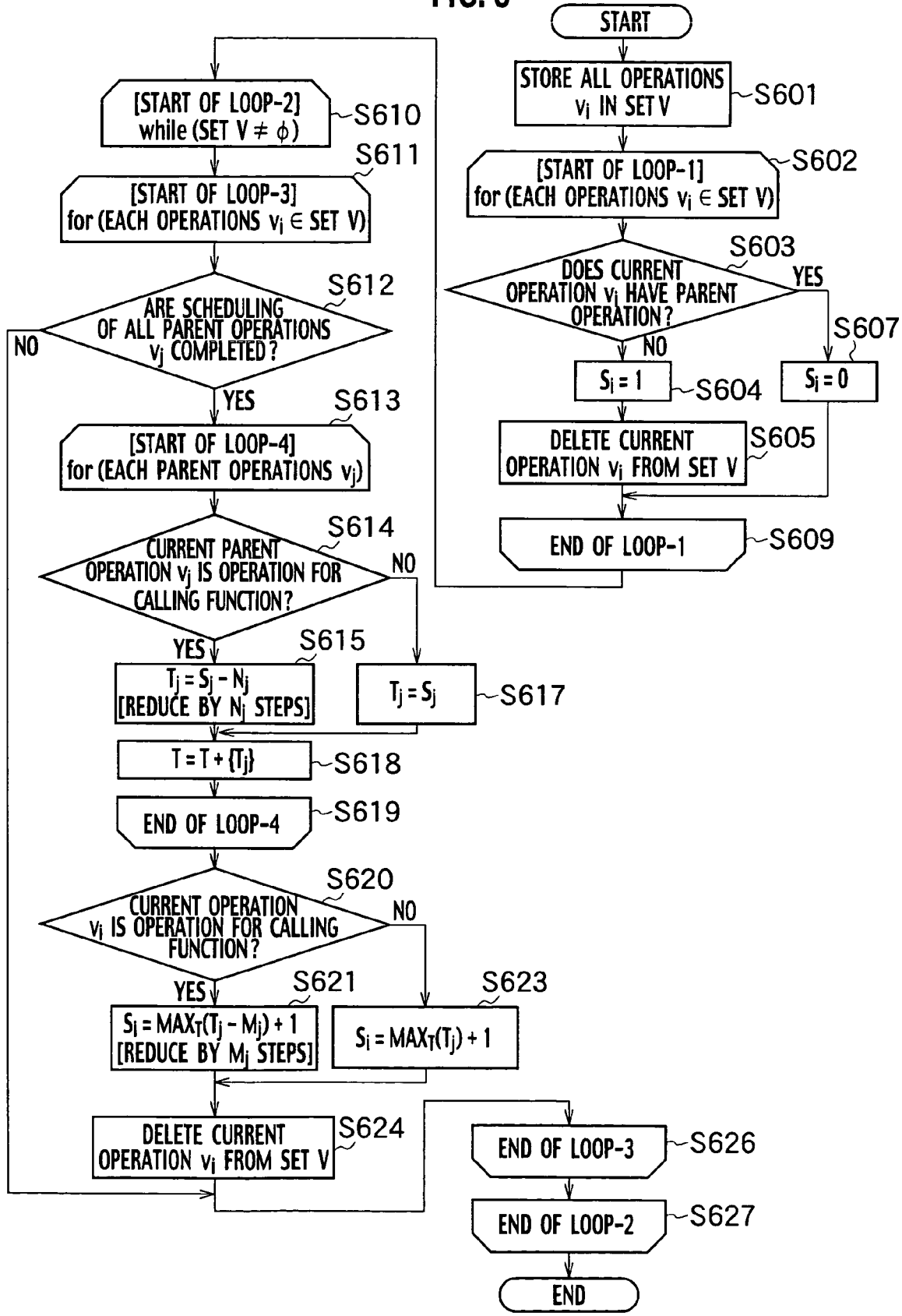
FIG. 8 is a flow chart showing an example of a scheduling algorithm performed by a scheduling processing section of the scheduler according to the first embodiment.

FIG. 8 shows an example of a scheduling algorithm performed by the scheduling processing section 41. FIG. 9 shows the scheduling algorithm shown in FIG. 8 described by using a programming language such like C language. The scheduling processing performed by the scheduling processing section 41 will be described in detail herein below. The scheduling processing section 41 schedules the behavioral descriptions as shown in FIG. 3 in order to achieve the scheduling result as shown in FIG. 5 by using the scheduling algorithm shown in FIG. 8.

First, in Step S601, the scheduling processing section 41 stores all operations $v_i$ (operations 201 to 206 shown in FIG. 3) in a Set V.

Next, in a loop processing [LOOP-1] from Step S602 to Step S609, the scheduling processing section 41 schedules the operations $v_i$ having no parent operation, that is, the operation $v_i$ not using results of other operations. In the example shown in FIG. 3, the operations 201 and 203 are the operations having no parent operation.

In Step S603, the scheduling processing section 41 determines whether or not the operation $v_i$ has one or more parent operations based on the data dependency between the operations expressed in the DFG 30. As a result of the determination, if the operation $v_i$ has no parent operation, in Step S604, the scheduling processing section 41 schedules the operation $v_i$ into control step "1" (sets "1" to control step $S_i$). Further, in Step S605, the scheduling processing section 41 deletes the operation $v_i$ from the Set V.

On the other hand, as a result of the determination of Step S603, if the operation $v_i$ has one or more parent operations, that is, if the operation $v_i$ uses operation results of other operations, the scheduling processing section 41 sets "0" to control step $S_i$ in Step S607.

After the loop processing [LOOP-1] from Step S602 to Step S609 is completed, in a loop processing [LOOP-2] from Step S610 to Step S627, the scheduling processing section 41 schedules the operations $v_i$ remaining in the Set V. The operations $v_i$ remaining in the Set V are the operations 203 to 206 not yet to be scheduled.

In Step S610 at the first iteration of a loop processing [LOOP-2] ("while" sentence), the Set V consists of four operations as follows:

$$V=\{OP3, g, OP4, OP5\}. \quad (1)$$

In Step S611 at the first iteration of a loop processing [LOOP-3] ("for" sentence), assuming that the operation $v_i$ is the operation OP3 (where i=3), the parent operation $v_j$ of the operation $v_3$ (operation OP3) is only the operation OP2. The operation OP2 is already scheduled into control step "1" (where $S_i$=1). Therefore, in Step S612, the scheduling processing section 41 determines that all parent operations $v_j$ of the operation $v_3$ are already scheduled.

Next, the scheduling processing section 41 starts a loop processing [LOOP-4] ("for" sentence) in Step S613. In Step S614, the scheduling processing section 41 determines whether or not the parent operation $v_j$ of the operation $v_3$ is the operation calling a function. At this time, since the parent operation $v_j$ of the operation $v_3$ is not the operation for calling a function, the scheduling processing section 41 sets "1" to Variable $T_j$. In Step S613 to Step S619, the scheduling processing section 41 collects the values of Variable $T_j$ about all the parent operations $v_j$ of the operation $v_3$, and stores the values of Variable $T_j$ into a Set T in Step S618. The parent operation $v_j$ of the operation OP3 is only the operation OP2, therefore, as a result of the LOOP-4 from Step S613 to Step S619, the Set T consists of one value as follows:

$$T=\{1\}. \quad (2)$$

Next, in Step S620 to Step S623, the scheduling processing section 41 determines the control step to schedule the operation $v_3$ (operation OP3). More specifically, in Step S620, the scheduling processing section 41 determines whether or not the operation $v_3$ is the operation calling a function. At this time, the operation $v_3$ is not the operation calling a function. Therefore, in Step S623, the scheduling processing section 41 sets the value of which "1" is added to the maximum value of the Set T, to the control step $S_i$, according to the following equation (3a):

$$S_i = MAX_T(T_j)+1. \quad (3a)$$

As a result of Step S623, the value of control step $S_i$ (where i=3) of the operation $v_3$ (operation OP3) is calculated as follows:

$$S_3=2. \quad (3b)$$

Thus, the operation OP3 is scheduled into control step "2".

Returning to the LOOP-3 in Step S611 ("for" sentence), at the second iteration of the LOOP-3, assuming that the operation $v_i$ is the operation "g" (where i=g), the parent operations $v_j$ of the operation $v_g$ (operation "g") are the operation OP1 and the operation OP3. The operation OP1 is already scheduled into control step "1" (where $S_1$=1), and the operation OP3 is already scheduled into control step "2" (where $S_3$=2). Therefore, in Step S612, the scheduling processing section 41 determines that all parent operations $v_j$ of the operation $v_g$ are already scheduled.

Furthermore, the parent operation $v_j$ of the operation $v_g$ is not an operation calling a function. Therefore, as a result of the LOOP-4 from Step S613 to Step S619, the Set T consists of values as follows:

$$T=\{1, 2\}. \quad (4)$$

Figure 10:
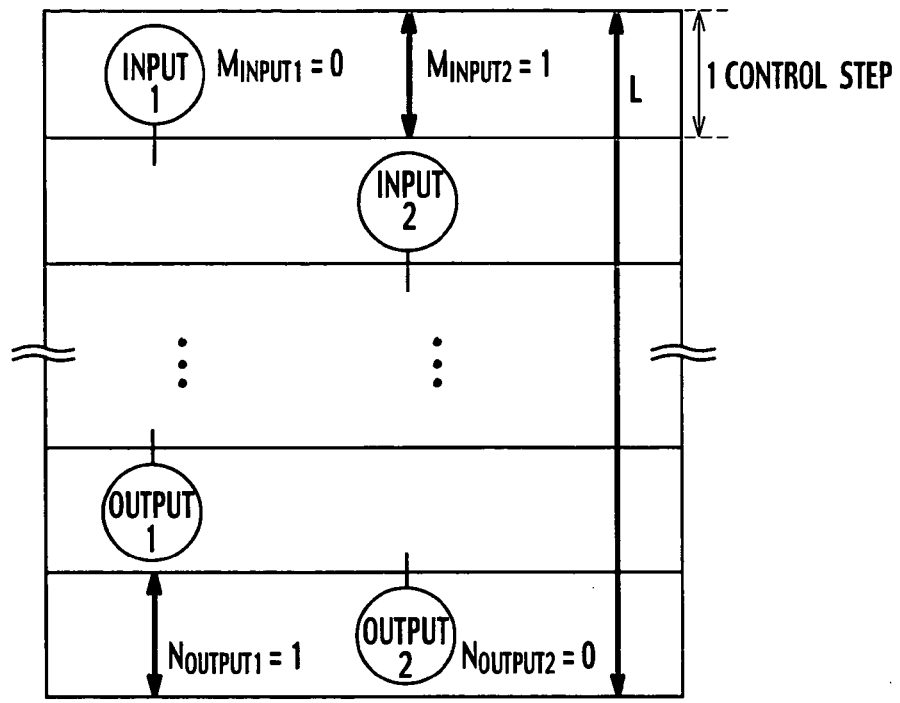
FIG. 10 is an illustration showing an example of schedule information used by the scheduler according to the first embodiment.
Figure 11:
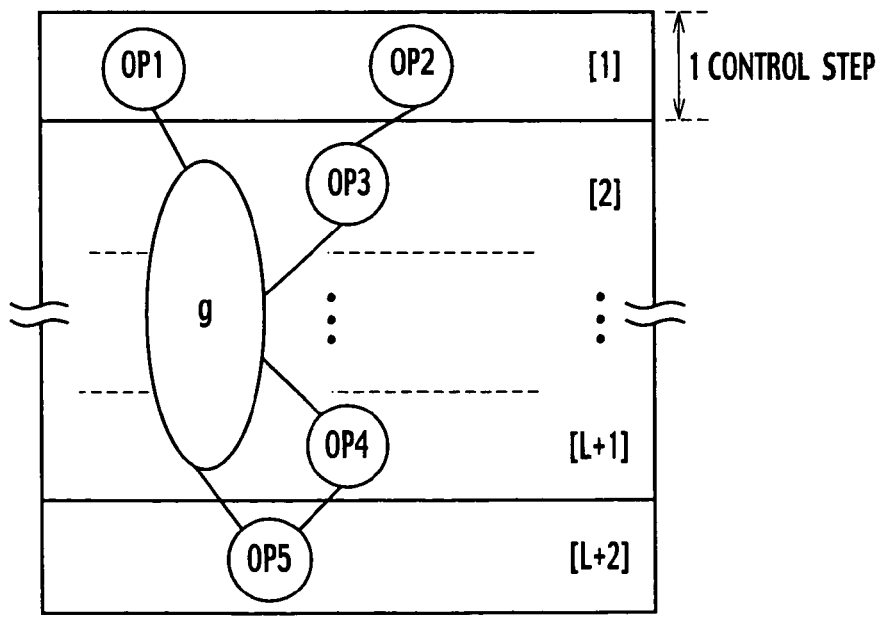
FIG. 11 is an illustration showing an example of results scheduled by the scheduling processing section according to the first embodiment.

Next, in Step S620 to Step S623, the scheduling processing section 41 determines the control step to schedule the operation $v_g$ (operation "g"). At this time, the operation $v_g$ is the operation calling the function "g". Therefore, in Step S621, the scheduling processing section 41 sets the value of which "1" is added to the maximum value of (Tj-Mj) in the Set T, to the control step $S_i$, according to the following equation:

$$S_i = MAX_T(T_j - M_j)+1, \quad (5)$$

where $M_j$ is schedule information about the function "g". At this time, it is assumed that the schedule information $M_j$ and $N_j$ about the function "g" is stored in the lower-hierarchy scheduling library 45 such as shown in FIG. 10. More specifically, the schedule information $M_j$ and $N_j$ about the function "g" are set as follows:

$$M_{INPUT1}=0, M_{INPUT2}=1,$$

$$N_{OUTPUT1}=1, N_{OUTPUT2}=0. \quad (6)$$

Assuming that the output of the operation OP1 is connected to INPUT1 of the function "g" and the output of the operation OP3 is connected to INPUT2 of the function "g", the values of $(T_j - M_j)$ of the Set T are set as follows:

$$T_1 - M_{INPUT1}=1-0=1,$$

$$T_3 - M_{INPUT2}=2-1=1. \quad (7)$$

As a result of Step S621, the value of control step $S_i$ (where i=g) of the operation $v_g$ (operation "g") is calculated as follows:

$$S_g=2. \quad (8)$$

Thus, the operation $v_g$ (operation "g") is scheduled from control step "2" in parallel with the operation OP3. As shown in FIG. 10, since the number of cycles required to execute the operation "g" is L cycles, the operation "g" calling the function is scheduled into a span of control steps "2" to "L+1".

Returning to the LOOP-3 in Step S611 ("for" sentence) at the third iteration of the LOOP-3, assuming that the operation $v_i$ is the operation OP4 (where i=4), the parent operation $v_j$ of the operation $v_4$ (operation OP4) is only the operation "g". The operation "g" is already scheduled into control steps "2" to "L+1". Assuming that the OUPUT1 of the operation "g" is connected to the operation OP4, since the parent operation $v_j$ (operation "g") of the operation OP4 is the operation calling function (in Step S614), in Step S615, the scheduling processing section 41 calculates the value $T_j$ according to the following equation (9):

$$T_j = (L+1) - 1. \tag{9}$$

Furthermore, since the parent operation $v_j$ of the operation $V_4$ (operation OP4) is only the operation "g", the values of Set T are collected by the scheduling processing section 41 in Step S613 to Step S619 as follows:

$$T = \{L\}. \tag{10}$$

As a result of the determination of Step S620, the operation $v_i$ (operation OP4) is not an operation for calling the function. Therefore, as a result of Step S623, the value of control step $S_4$ is calculated as follows:

$$S_1 = L+1. \tag{11}$$

Thus, the operation OP4 is scheduled into control step "L+1" in parallel with a part of the operation $v_i$ (operation "g").

Returning to the LOOP-3 in Step S611 ("for" sentence) at the fourth iteration of the LOOP-3, the operation $v_i$ is the operation OP5 (where i=5). The parent operations $v_j$ of the operation $v_5$ (operation OP5) are the operation "g" and the operation OP4. The operation "g" is already scheduled into control steps "2" to "L+1", and the operation OP4 is also scheduled into control step "L+1". Assuming that the OUPUT2 of the operation "g" is connected to the operation OP5, as a result of Step S614 to Step S617, the scheduling processing section 41 calculates the value $T_j$ according to the following equations (12, 13):

$$T_4 = L+1, \tag{12}$$

$$T_g = L+1-0 = L+1. \tag{13}$$

Thus, the values of Set T are collected by the scheduling processing section 41 in Step S613 to Step S619 as follows:

$$T = \{L+1\}. \tag{14}$$

As a result of the determination of Step S620, the operation $v_5$ is not an operation for calling the function. Therefore, as a result of Step S623, the value of control step $S_4$ is calculated as follows:

$$S_1 = L+2. \tag{15}$$

Thus, the operation OP5 is scheduled into control step "L+2".

In the above process of the LOOP-3 (from Step S611 to Step S626), the scheduling processing section 41 deletes the operations $v_i$ from the Set V in Step S624. Therefore, at the time when the process of the LOOP-3 (from Step S611 to Step S626) is completed, the Set V becomes an empty set. Then, the process of the LOOP-2 (from Step S610 to Step S627) is also completed, and then the series of the processing by using the scheduling algorithm shown in FIGS. 8 and 9 is completed.

According to the above processing, it is scheduled in order that the operation OP3 and the operation OP4 execute in parallel with the execution of the function "g" belonging to the lower-hierarchy. Therefore, it is possible to obtain the optimal scheduling result eliminating redundant cycle steps.

Moreover, the scheduler 40 uses only the schedule information of the lower-hierarchy. Therefore, the above scheduling algorithm is applicable, not only when the behavioral descriptions of the lower-hierarchy are already prepared, but also when only descriptions of a register transfer level of the lower-hierarchy are prepared. Thus, it is possible to make full use of design assets.

Scheduling Processing in Second Embodiment

Figure 12:
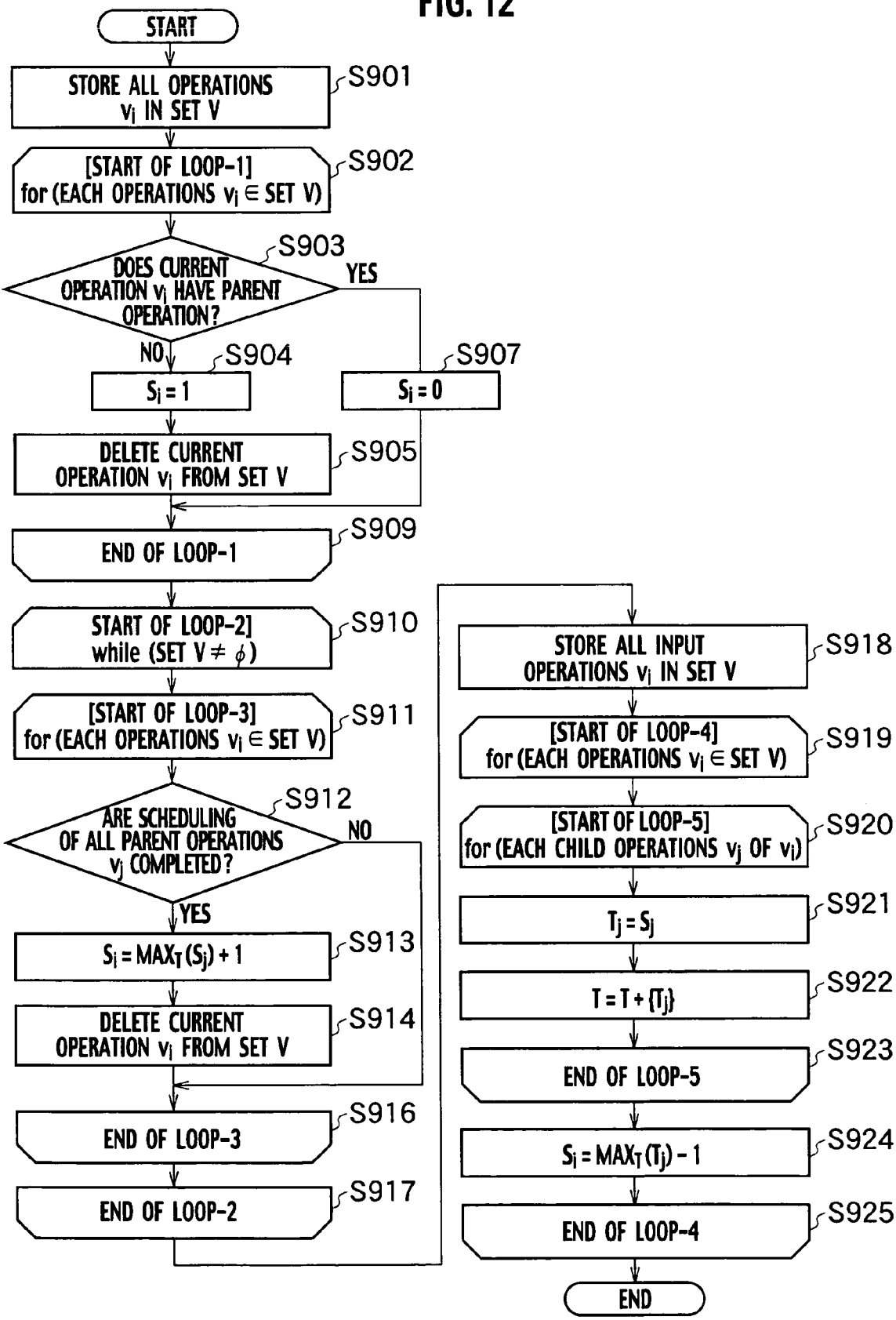
FIG. 12 is a flow chart showing an example of a scheduling algorithm performed by the scheduling processing section of the scheduler according to a second embodiment.

Next, the scheduling processing performed by the scheduling processing section 41 at the time of scheduling the functions belonging to the lower-hierarchy will be explained in detail herein below. In addition, FIG. 12 shows an example of a scheduling algorithm performed by the scheduling processing section 41 at the time of scheduling the functions belonging to the lower-hierarchy. FIG. 13 shows the scheduling algorithm shown in FIG. 12 described by using the programming language such like C language. Detailed explanation will be described herein below according to an example of behavioral descriptions of function "g" belonging to the lower-layer shown in FIG. 14.

Figure 14:
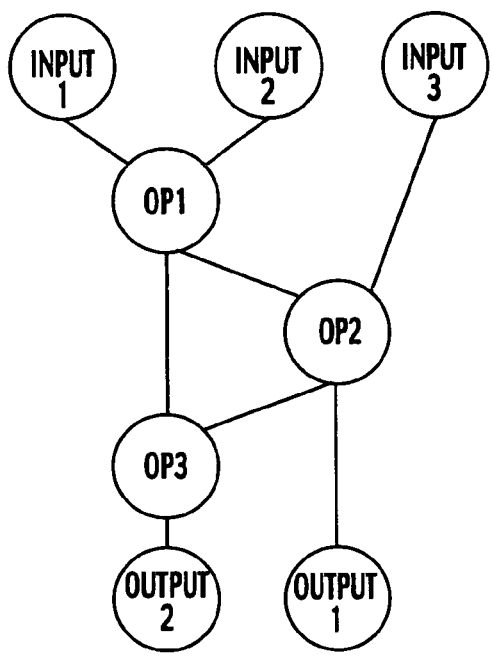
FIG. 14 is a data-flow graph (DFG) showing an example of behavioral descriptions of a lower-hierarchy to be scheduled according to the second embodiment.

First, in Step S901, the scheduling processing section 41 stores all operations $v_i$ (operations INPUT1, INPUT2, INPUT3, OP1, OP2, OP3, OUTPUT1 and OUTPUT2 shown in FIG. 14) in a Set V.

Next, in a loop processing [LOOP-1] from Step S902 to Step S909, the scheduling processing section 41 schedules all of the operations $v_i$ having no parent operation. More specifically, in Step S903, the scheduling processing section 41 determines whether or not the operation $v_i$ has one or more parent operations. As a result of the determination in Step S903, if the operation $v_i$ has no parent operation, in Step S904, the scheduling processing section 41 schedules the operation $v_i$ into control step "1" (sets "1" to control step $S_i$). At this time, the operations $v_i$ having no parent operation are the operations INPUT1, INPUT2 and INPUT3. Therefore, the control step $S_i$ is calculated as follows:

$$S_{INPUT1} = 1, S_{INPUT2} = 1, S_{INPUT3} = 1. \tag{16}$$

Thus, each operation $v_i$ (operations INPUT1, INPUT2 and INPUT3) is scheduled into control step "1" respectively. Further, in Step S905, the scheduling processing section 41 deletes the operation $v_i$ (operations INPUT1, INPUT2 and INPUT3) from the Set V.

On the other hand, in Step S907, the scheduling processing section 41 sets "0" to control step $S_i$ regarding the operation $v_i$ having one or more parent operations.

After the loop processing [LOOP-1] from Step S902 to Step S909 is completed, this processing goes to a loop processing [LOOP-2] from Step S910 to Step S917. Before entering Step S910, unscheduled operations are stored in the Set V. The Set V consists of five operations as follows:

$$V = \{OP1, OP3, OP3, OUTPUT1, OUTPUT2\}. \tag{17}$$

At the first iteration of a loop processing [LOOP-3] ("for" sentence) from Step S911 to Step S916, assuming that the operation OP1 (where i=OP1) is selected as the operation $v_i$, the parent operations of the operation $v_{OP1}$ (operation OP1) are the operations INPUT1 and INPUT2. Therefore, in Step S912, the scheduling processing section 41 determines that both of the parent operations $v_j$ of the operation $v_{OP1}$ are already scheduled. That is, the operations INPUT1 and INPUT2 are scheduled into control step "1", therefore, the control step $S_i$ of the operations INPUT1 and INPUT2 are as follows:

$$S_{INPUT1} = 1, S_{INPUT2} = 1. \tag{18}$$

Thus, in Step S913, the scheduling processing section 41 calculates the control step $S_{OP1}$, which is a scheduling point of the operation $v_{OP1}$ (operation OP1), as follows:

$$S_{OP1}=1+1=2. \tag{19}$$

Consequently, the operation $v_{OP1}$ (operation OP1) is scheduled into control step "2". Further, the scheduling processing section 41 deletes the scheduled operation $v_{OP1}$ from the Set V.

The scheduling processing section 41 performs similar processing to the operations $v_i$ (operations OP2, OP3, OUTPUT1 and OUTPUT2) in LOOP-3 from Step S911 to Step S916, and then the control step $S_i$ of each operations $v_i$ is calculated as follows:

$$S_{OP2}=3, S_{OP3}=4, S_{OUTPUT1}=4, S_{OUTPUT2}=5. \tag{20}$$

Thus, the operation $v_{OP2}$ (operation OP2) is scheduled into control step "3"; the operation $v_{OP3}$ (operation OP3) and the operation $v_{OUTPUT1}$ (operation OUTPUT1) are scheduled into control step "4"; and the operation $v_{OUTPUT2}$ (operation OUTPUT2) is scheduled into control step "5". Then, the scheduled operations $v_i$ is deleted from the Set V. Therefore, at the time when the process of the LOOP-3 (from Step S911 to Step S916) is completed, the Set V becomes an empty set. Then, the process of the LOOP-2 (from Step S910 to Step S9177) is also completed.

Next, in Step S918, the scheduling processing section 41 stores all of the input operations $v_i$ in the Set V. Therefore, the Set V consists of values as follows:

$$V=\{INPUT1, INPUT2, INPUT3\}. \tag{21}$$

These operations $v_i$ (operations INPUT1, INPUT2 and INPUT3) stored in the Set V are the targets for the following LOOP-4 from step S919 to Step S925. At the first iteration of the LOOP-4, assuming that the operation INPUT1 is selected as the operation $v_i$, the child operation $v_j$ of the operation $V_{INPUT1}$ (operation INPUT1) is only operation OP1. Therefore, the scheduling processing section 41 collects control step $S_{OP1}$, which is a scheduling point of the operation $v_{OP1}$ (operation OP1), into the Set T in a LOOP-5 from Step 920 to Step S923. Consequently, the Set T consists of value as follows:

$$V=\{S_{OP1}=2\}. \tag{22}$$

Thus, in Step S924, the scheduling processing section 41 calculates the control step $S_{INPUT1}$ of the operation $V_{INPUT1}$ as follows:

$$S_{INPUT1}=1. \tag{23}$$

Consequently, the operation $v_{INPUT1}$ (operation INPUT1) is finally scheduled into control step "1".

Next, at the second iteration of the LOOP-4 from Step S919 to Step S925, assuming that the operation INPUT2 is selected as the operation $v_i$, the child operation $v_j$ of the operation $v_{INPUT2}$ (operation INPUT2) is only operation OP1 as in the case of operation $v_{INPUT1}$. Therefore, the scheduling processing section 41 calculates the control step $S_{INPUT2}$ of the operation $v_{INPUT2}$ as follows:

$$S_{INPUT2}=1. \tag{24}$$

Consequently, the operation $v_{INPUT2}$ (operation INPUT2) is scheduled into control step "1".

Furthermore, at the third iteration of the LOOP-4 from Step S919 to Step S925, assuming that the operation INPUT3 is selected as the operation $v_i$, the child operation $v_j$ of the operation $v_{INPUT3}$ (operation INPUT3) is only operation OP2. Therefore, the scheduling processing section 41 collects control step $S_{OP2}$, which is a scheduling point of the operation $v_{OP2}$ (operation OP2), into the Set T in the LOOP-5 from Step 920 to Step S923. Consequently, the Set T consists of value as follows:

$$V=\{S_{OP2}=3\}. \tag{25}$$

Thus, in Step S924, the scheduling processing section 41 calculates the final control step $S_{INPUT3}$ of the operation $V_{INPUT3}$ (operation INPUT3) as follows:

$$S_{INPUT3}=2. \tag{26}$$

Consequently, the operation $v_{INPUT3}$ (operation INPUT3) is finally scheduled into control step "2".

As explained above, when scheduling the function belonging to the lower-hierarchy, the scheduling processing section 41 optimizes the schedule of the function in order that the operations $v_i$ (operations INPUT1, INPUT2 and INPUT3) inputting data to the function are assigned to the control step immediately before the operations OPT1 and OPT2 using the input data in the function. The scheduling processing section 41 further optimizes the schedule of the function in order that the operations OUTPUT1 and OUTPUT2 outputting data from the function are assigned to the control step immediately after the operations OPT2 and OPT3 calculating the output data in the function.

Figure 15:
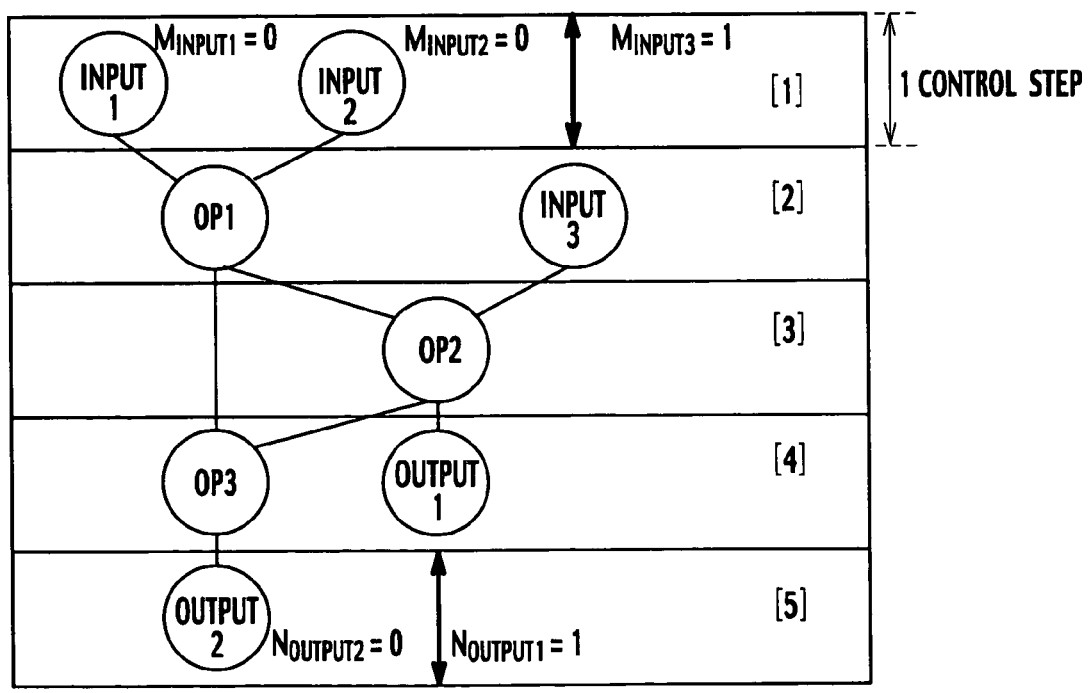
FIG. 15 is an illustration showing an example of results scheduled by the scheduling processing section according to the second embodiment.

FIG. 15 shows an example of results finally obtained by the scheduling processing section 41 as a result of above processing. The schedule information extraction section 43 extracts the number of first clock cycles and the number of second clock cycles of the function as schedule information from the results. The number of first clock cycles is the number of clock cycles after execution of the function is started until an input data is used in the function. The number of the second clock cycles is the number of clock cycles after an output data is outputted until the execution of the function is completed. The schedule information (the number $M_i$ of first clock cycles and the number $N_i$ of second clock cycles) extracted by the schedule information extraction section 43 are set as follows:

$$M_{INPUT1}=0, M_{INPUT2}=0, M_{INPUT3}=1,$$

$$N_{OUTPUT1}=1, N_{OUTPUT2}=0. \tag{27}$$

Then, the schedule information registration section 44 stores the extracted number of first clock cycles and the extracted number of second clock cycles in the lower-hierarchy scheduling library 45 as the schedule information.

Scheduling Processing in Third Embodiment

Next, the scheduling processing performed by the scheduler 40 in the case where the two or more schedule information of one function belonging to the lower-hierarchy are stored in the lower-hierarchy scheduling library 45 will be explained in detail herein below.

Figure 16:
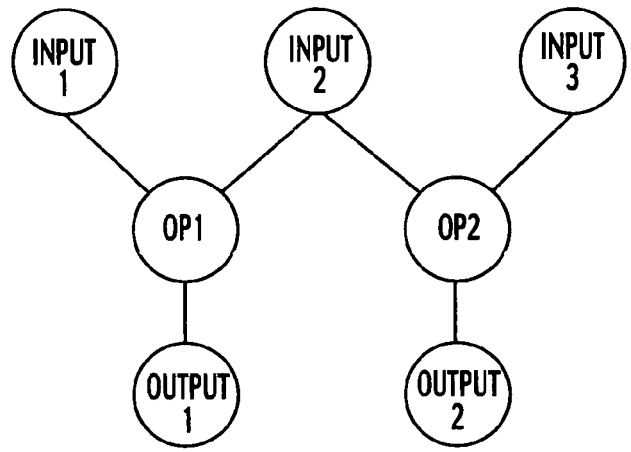
FIG. 16 is a data-flow graph (DFG) showing an example of behavioral descriptions of a lower-hierarchy to be scheduled according to a third embodiment.

FIG. 16 shows an example of behavioral descriptions of a function "g" belonging to the lower-hierarchy. It is assumed that operation OP1 and operation OP2 are the operations that can be executed by the same arithmetic circuit. Furthermore, it is assumed that two or more kinds of scheduling results are obtained by scheduling of the behavioral descriptions of the function "g" by the scheduling processing section 41.

Figure 17:
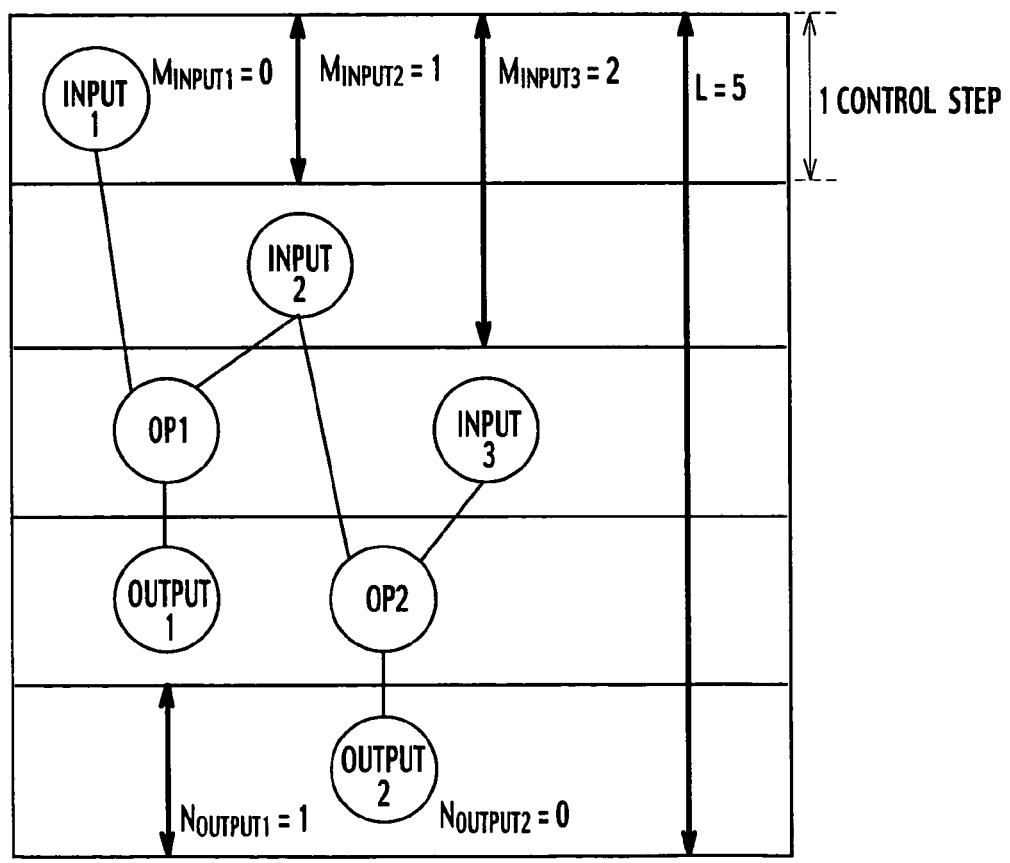
FIG. 17 is an illustration showing an example of first scheduling results (SCHEDULING 1) among two or more kinds of scheduling results in the third embodiment.

FIG. 17 shows an example of first scheduling results (SCHEDULING 1). In the first scheduling process, the scheduling processing section 41 schedules in order that: all three inputs (INPUT1, INPUT2 and INPUT3) are inputted from the same input pins; operation OP1 and operation OP2 are executed by the same arithmetic circuit; and two outputs (OUTPUT1 and OUTPUT2) are outputted to the same output pins. The schedule information of the first scheduling results is set as follows:

$$L=5, M_{INPUT1}=0, M_{INPUT2}=1, M_{INPUT3}=2,$$

$$N_{OUTPUT1}=1, N_{OUTPUT2}=0, \quad (28)$$

where L is the number of clock cycles required to execute the entire function, $M_i$ is the number of first clock cycles, and $N_i$ is the number of second clock cycles.

On the other hand, FIG. 18 shows an example of second scheduling results (SCHEDULING 2). In the second scheduling process, the scheduling processing section 41 schedules so that each of three inputs (INPUT1, INPUT2 and INPUT3) are inputted from different input pins, operation OP1 and operation OP2 are performed with different arithmetic circuits, and each of two outputs (OUTPUT1 and OUTPUT2) are outputted to different output pins. The schedule information of the second scheduling results is set as follows:

$$L=3, M_{INPUT1}=0, M_{INPUT2}=0, M_{INPUT3}=0,$$

$$N_{OUTPUT1}=0, N_{OUTPUT2}=0. \quad (29)$$

The schedule information extraction section 43 extracts the number of first clock cycles and the number of second clock cycles corresponding to the respective scheduling results as schedule information of the function "g" from the two kind of the scheduling results respectively. The schedule information registration section 44 stores each extracted schedule information corresponding to the respective scheduling results in the lower-hierarchy scheduling library 45. FIG. 19 shows schedule information stored in the lower-hierarchy scheduling library 45 corresponding to the respective scheduling results of the function "g".

The schedule information acquisition section 42 then acquires these schedule information from the lower-hierarchy scheduling library 45. The scheduling processing section 41 then performs scheduling process by using the schedule information acquired by the schedule information acquisition section 42, according to the logic circuit under design. Therefore, the scheduling processing section 41 can generates various scheduling results.

For example, the case of scheduling behavioral descriptions shown in FIG. 20 is assumed. In the behavioral descriptions shown in FIG. 20, the result of operation OP1 is connected to an input operation INPUT1 of the function "g", the result of operation OP4 is connected to an input operation INPUT2 of the function "g", and the result of operation OP9 is connected to an input operation INPUT3 of the function "g". In addition, it is assumed that the schedule information of the function "g" stored in the lower-hierarchy scheduling library 45 is shown in FIG. 19.

Figure 21:
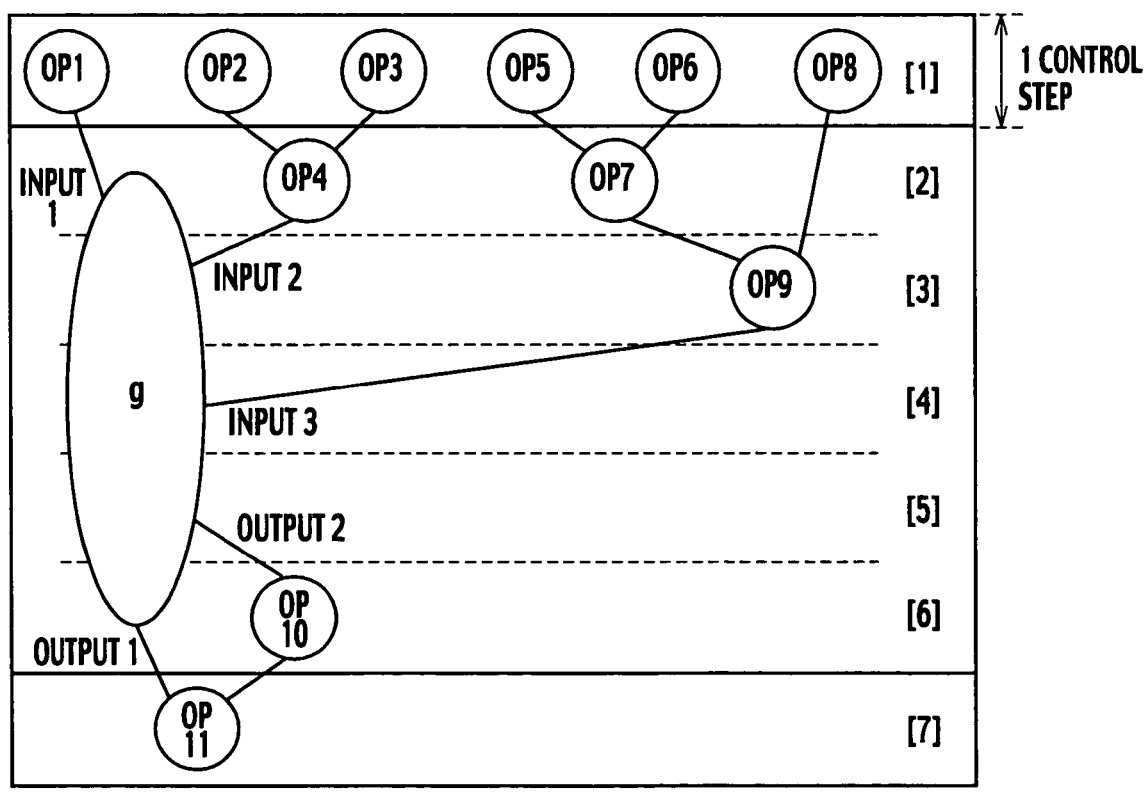
FIG. 21 is an illustration showing an example of results of scheduling the behavioral descriptions shown in FIG. 20 performed by the scheduler of the third embodiment using the schedule information extracted from the scheduling results shown in FIG. 17.
Figure 22:
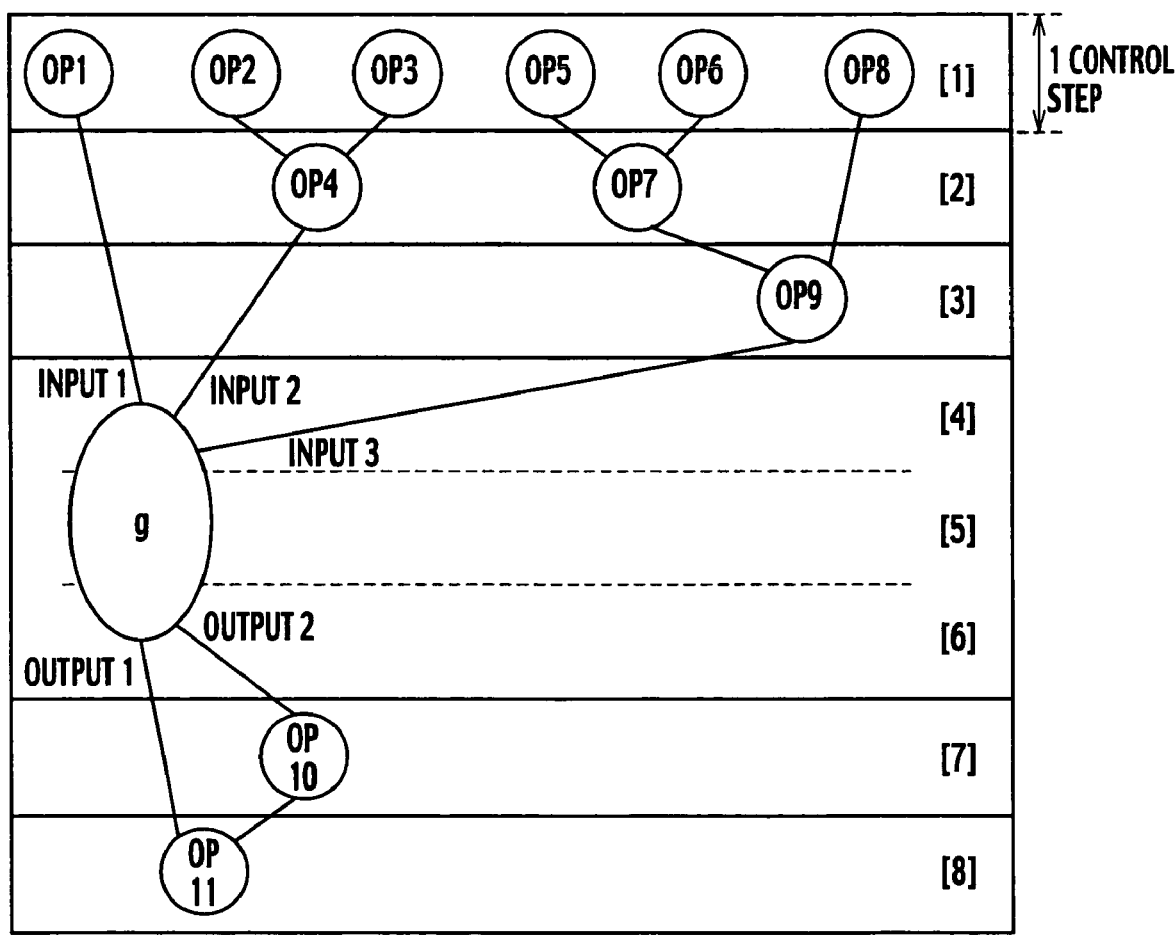
FIG. 22 is an illustration showing an example of results of scheduling the behavioral descriptions shown in FIG. 20 performed by the scheduler of the third embodiment using the schedule information extracted from the scheduling results shown in FIG. 18.

FIG. 21 shows an example of scheduling results performed by the scheduler 40 using the schedule information according to the first scheduling results (SCHEDULING 1) shown in FIG. 17, based on the scheduling algorism shown in FIG. 8 and FIG. 9. FIG. 22 shows an example of scheduling results performed by the scheduler 40 using the schedule information according to the second scheduling results (SCHEDULING 2) shown in FIG. 19, based on the scheduling algorism shown in FIG. 8 and FIG. 9.

As is evident from the scheduling results shown in FIG. 21 and the scheduling results shown in FIG. 22, it is possible to generate various scheduling results according to the scheduling results of the lower-hierarchy.

Scheduling Processing in Fourth Embodiment

Next, the scheduling processing performed by the scheduler 40 in the case where the two or more functions are called successively in behavioral descriptions belonging to the upper-hierarchy will be explained in detail herein below.

Figures 23, 24:
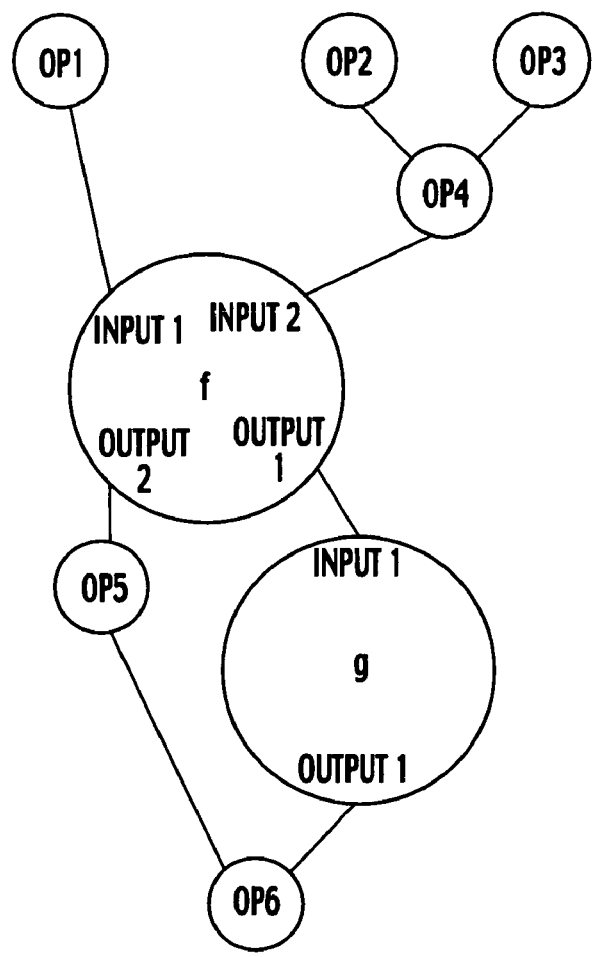
FIG. 23 is a data-flow graph (DFG) showing an example of behavioral descriptions in the case that two or more functions are called successively, according to a fourth embodiment.
FIG. 24 is an illustration showing an example of schedule information used by the scheduler of the fourth embodiment in order to schedule the behavioral description shown in FIG. 23.

FIG. 23 shows an example of behavioral descriptions in the case that function "f" and function "g" are called successively belonging to the lower-hierarchy. An operation OP1 is connected to an input operation INPUT1 of the function "f", an operation OP4 is connected to an input operation INPUT2 of the function "f", an input operation INPUT1 of the function "g" is connected to an output operation OUTPUT1 of the function "f", an operation OP5 is connected to an output operation OUTPUT2 of the function "f", and an output operation OUTPUT1 of the function "g" is connected to an operation OP6.

In a scheduling processing performed by the scheduling processing section 41 based on the scheduling algorism shown in FIGS. 8 and 9, the operations OP1, OP2, OP3 and OP4 and the function call operation "f" are already scheduled at the time when the function call operation "g" is to be scheduled. The scheduled operations are scheduled into the following control steps:

$$S_1=1, S_2=1, S_3=1, S_4=2, S_f=5. \quad (30)$$

At the first iteration of the LOOP-3 ("for" sentence) in Step S611 of the scheduling algorism shown in FIGS. 8 and 9, assuming that the operation $v_i$ is the operation "g", the values of the Set T collected in Step S613 to S619 by using the schedule information stored in the lower-hierarchy scheduling library 45 shown in FIG. 24 are set as follows:

$$T = \{T_1 = 1, T_2 = 1, T_3 = 1, T_4 = 2, T_f = 5 - 1 = 4\} \quad (31)$$

$$= \{1, 1, 1, 2, 4\}.$$

Therefore, in Step S621, the scheduling processing section 41 calculates the control step $S_g$ which the calling function operation "g" is scheduled into as follows:

$$S_g = T_f - M_{INPUT1} + 1 = 4 - 0 + 1 = 5. \quad (32)$$

Thus, the function call operation "g" is scheduled into control step "5".

Figure 25:
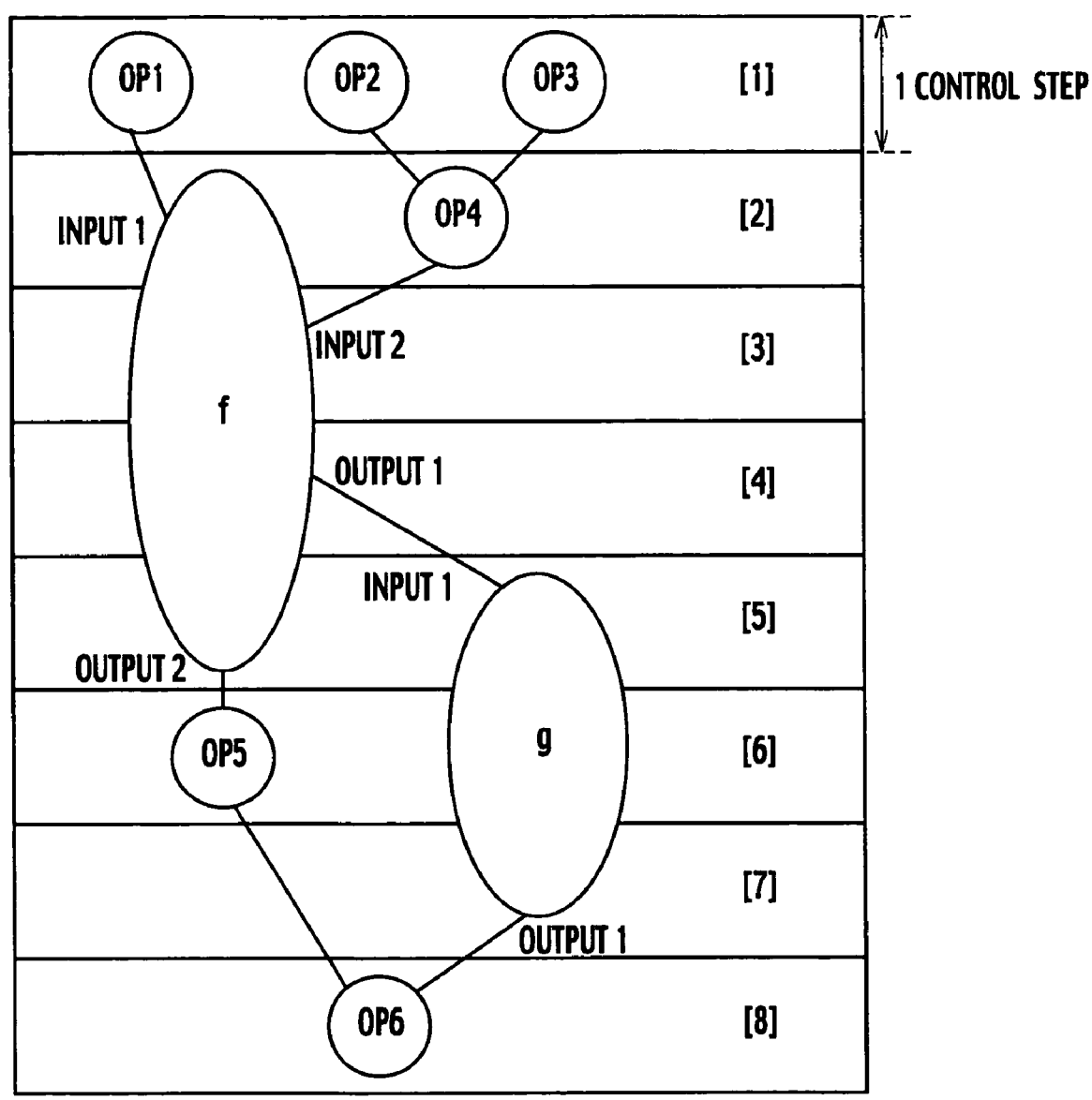
FIG. 25 is an illustration showing an example of results of scheduling the behavioral descriptions shown in FIG. 20 scheduled by the scheduler of the fourth embodiment using the schedule information shown in FIG. 24.
Figure 26:
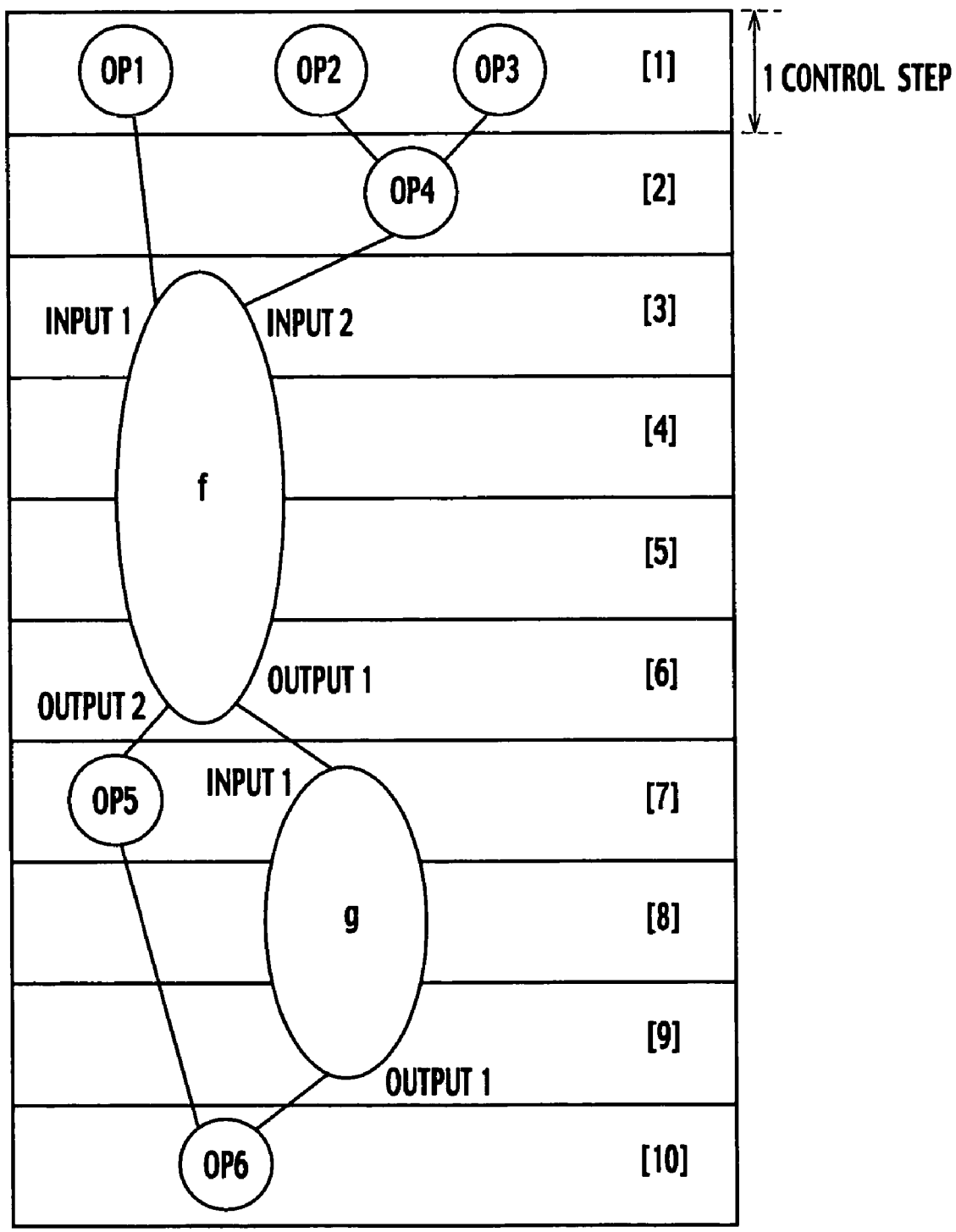
FIG. 26 is an illustration showing an example of results of scheduling the behavioral descriptions shown in FIG. 20 scheduled by the ASAP scheduling algorithm by using the schedule information shown in FIG. 24.

The scheduling processing section 41 schedules the remaining operations according to the scheduling algorism shown in FIGS. 8 and 9. Consequently, the scheduling result shown in FIG. 25 is obtained. More specifically, in the case where two or more functions (functions "f" and "g") are called in the behavioral descriptions belonging to the upper-hierarchy, the scheduling processing section 41 obtains the operations (input operation INPUT1) which can execute in which the second clock cycle of the function "f" among two or more functions, from among the following operations of the function "g". The scheduling processing section 41 then optimizes the schedule of the following function "g" so that the obtained operation (input operation INPUT1) is executed in parallel with the function "f".

Thus, it is possible to obtain the scheduling result to execute the parallel processing by using the behavioral descriptions in which the functions is called successively.

On the other hand, according to the conventional scheduling method, it is scheduled so that after the execution of the function "f" is perfectly completed, the execution of the function "g" is started.

As explained above, according to the present embodiments, the scheduler, the scheduling method, the scheduling program and the high-level synthesis apparatus for scheduling optimally so that the lower-hierarchy functions are executed in parallel with the upper-hierarchy calling the functions, while maintaining the hierarchical structure of the behavioral descriptions having the hierarchical structure.

Although the embodiments of the present invention have been described in detail, the present invention may be embodied in other specific forms without departing from the spirit or essential characteristics thereof.

The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A scheduler for partitioning behavioral operations of a logic circuit under design into groups executed in each clock cycle, the behavioral operations with a hierarchical structure being described in behavioral descriptions, the scheduler comprising:

a schedule information acquisition section configured to acquire a number of first clock cycles and a number of second clock cycles as schedule information of a function belonging to a lower-hierarchy described in the behavioral descriptions, the number of the first clock cycles being the number of clock cycles after an execution of the function is started until an input data of the function is used in the function, the number of the second clock cycles being the number of clock cycles after an output data of the function is outputted until the execution of the function is completed; and a scheduling processing section configured to obtain operations executable within a range of the first clock cycles and operations executable within a range of the second clock cycles from among operations belonging to an upper-hierarchy for calling the function, based on the acquired schedule information of the lower-hierarchy, the scheduling processing section further configured to schedule the upper-hierarchy in order that the obtained operations belonging to the upper-hierarchy execute in parallel with the function belonging to the lower-hierarchy within the range of the first clock cycles and the second clock cycles while maintaining the hierarchical structure of the behavioral descriptions.

2. The scheduler of claim 1, wherein
the scheduling processing section schedules the function belonging to the lower-hierarchy in order that an operation for inputting input data to the function belonging to the lower-hierarchy is assigned to immediately before an operation using the input data in the function, and an operation for outputting data from the function is assigned to immediately after an operation calculating the output data in the function.

3. The scheduler of claim 2, further comprising:
a schedule information extraction section configured to extract the number of first clock cycles and the number of second clock cycles from a result of the scheduling of the function belonging to the lower-hierarchy; and
a schedule information registration section configured to store the extracted number of the first clock cycles and the extracted number of the second clock cycles as the schedule information into a lower-hierarchy scheduling library; and wherein the schedule information acquisition section acquires the schedule information stored in the lower-hierarchy scheduling library.

4. The scheduler of claim 3, wherein
in the case where two or more schedule information of the function are stored in the lower-hierarchy scheduling library, the scheduling processing section schedules by using the two or more schedule information acquired by the schedule information acquisition section, according to the logical circuit under design.

5. The scheduler of claim 1, wherein
in the case where two or more functions are successively called in the behavioral descriptions of the upper-hierarchy, the scheduling processing section obtains operations executable in the second clock cycles of the preceding function among the two or more functions, from among operations of the following function, and schedules the following function in order that the obtained operations of the following function execute in parallel with the preceding function.

6. The scheduler of claim 2, wherein
in the case where two or more functions are successively called in the behavioral descriptions of the upper-hierarchy, the scheduling processing section obtains operations executable in the second clock cycles of the preceding function among the two or more functions, from among operations of the following function, and schedules the following function in order that the obtained operations of the following function execute in parallel with the preceding function.

7. The scheduler of claim 3, wherein
in the case where two or more functions are successively called in the behavioral descriptions of the upper-hierarchy, the scheduling processing section obtains operations executable in the second clock cycles of the preceding function among the two or more functions, from among operations of the following function, and schedules the following function in order that the obtained operations of the following function execute in parallel with the preceding function.

8. The scheduler of claim 4, wherein
in the case where two or more functions are successively called in the behavioral descriptions of the upper-hierarchy, the scheduling processing section obtains operations executable in the second clock cycles of the preceding function among the two or more functions, from among operations of the following function, and schedules the following function in order that the obtained operations of the following function execute in parallel with the preceding function.

9. A method implemented by a scheduler for partitioning behavioral operations of a logic circuit under design into groups executed in each clock cycle, the behavioral operations with a hierarchical structure being described in behavioral descriptions, the method comprising:

acquiring a number of first clock cycles and a number of second clock cycles as schedule information of a function belonging to a lower-hierarchy described in the behavioral descriptions, the number of the first clock cycles being the number of clock cycles after an execution of the function is started until an input data of the function is used in the function, the number of the second clock cycles being the number of clock cycles after an output data of the function is outputted until the execution of the function is completed;

obtaining operations executable within a range of the first clock cycles and operations executable within a range of the second clock cycles from among operations belonging to an upper-hierarchy for calling the function, based on the acquired schedule information of the lower-hierarchy; and optimizing a schedule of the upper-hierarchy in order that the obtained operations belonging to the upper-hierarchy execute in parallel with the function belonging to the lower-hierarchy within the range of the first clock cycles and the second clock cycles while maintaining the hierarchical structure of the behavioral descriptions.

10. A computer executable program for partitioning behavioral operations of a logic circuit under design into groups executed in each clock cycle, the behavioral operations with a hierarchical structure being described in behavioral descriptions, the computer executable program comprising:

acquiring a number of first clock cycles and a number of second clock cycles as schedule information of a function belonging to a lower-hierarchy described in the behavioral descriptions, the number of the first clock cycles being the number of clock cycles after an execution of the function is started until an input data of the function is used in the function, the number of the second clock cycles being the number of clock cycles after an output data of the function is outputted until the execution of the function is completed;

obtaining operations executable within a range of the first clock cycles and operations executable within a range of the second clock cycles from among operations belonging to an upper-hierarchy for calling the function, based on the acquired schedule information of the lower-hierarchy, based on the acquired schedule information; and scheduling the upper-hierarchy in order that the obtained operations belonging to the upper-hierarchy execute in parallel with the function belonging to the lower-hierarchy within the range of the first clock cycles and the second clock cycles while maintaining the hierarchical structure of the behavioral descriptions.

11. The computer executable program of claim 10, wherein in the scheduling, the function belonging to the lower-hierarchy is scheduled in order that an operation for inputting input data to the function belonging to the lower-hierarchy is assigned to immediately before an operation using the input data in the function, and an operation for outputting data from the function is assigned to immediately after an operation calculating the output data in the function.

12. The computer executable program of claim 11, further comprising:

extracting the number of first clock cycles and the number of second clock cycles from a result of the scheduling of the function belonging to the lower-hierarchy; and storing the extracted number of the first clock cycles and the extracted number of the second clock cycles as the schedule information into a lower-hierarchy scheduling library; and wherein in the acquiring of the schedule information, the schedule information acquired from the lower-hierarchy scheduling library.

13. The computer executable program of claim 12, wherein in the case where two or more schedule information of the function are stored in the lower-hierarchy scheduling library, the scheduling is performed by using the acquired two or more schedule information according to the logical circuit under design.

14. The computer executable program of claim 10, wherein in the case where two or more functions are successively called in the behavioral descriptions of the upper-hierarchy, in the scheduling, operations executable in the second clock cycles of the preceding function among the two or more functions are obtained from among operations of the following function, and the following function is scheduled in order that the obtained operations of the following function execute in parallel with the preceding function.

15. The computer executable program of claim 11, wherein in the case where two or more functions are successively called in the behavioral descriptions of the upper-hierarchy, in the scheduling, operations executable in the second clock cycles of the preceding function among the two or more functions are obtained from among operations of the following function, and the following function is scheduled in order that the obtained operations of the following function execute in parallel with the preceding function.

16. The computer executable program of claim 12, wherein in the case where two or more functions are successively called in the behavioral descriptions of the upper-hierarchy, in the scheduling, operations executable in the second clock cycles of the preceding function among the two or more functions are obtained from among operations of the following function, and the following function is scheduled in order that the obtained operations of the following function execute in parallel with the preceding function.

17. The computer executable program of claim 13, wherein in the case where two or more functions are successively called in the behavioral descriptions of the upper-hierarchy, in the scheduling, operations executable in the second clock cycles of the preceding function among the two or more functions are obtained from among operations of the following function, and the following function is scheduled in order that the obtained operations of the following function execute in parallel with the preceding function.

18. An apparatus for high-level synthesis comprising:

a behavioral description analyzer configured to analyze behavioral descriptions describing behavioral operations of a logic circuit under design and to generate a data-flow graph;

scheduler configured to partition behavioral operations in the data-flow graph into groups executed in each clock cycle, the scheduler comprising:

a schedule information acquisition section configured to acquire a number of first clock cycles and a number of second clock cycles as schedule information of a function belonging to a lower-hierarchy described in the data-flow graph, the number of the first clock cycles being the number of clock cycles after an execution of the function is started until an input data of the function is used in the function, the number of the second clock cycles being the number of clock cycles after an output data of the function is outputted until the execution of the function is completed; and a scheduling processing section configured to obtain operations executable within a range of the first clock cycles and operations executable within a range of the second clock cycles from among operations belonging to an upper-hierarchy for calling the function, based on the acquired schedule information of the lower-hierarchy, the scheduling processing section further configured to schedule the upper-hierarchy in order that the obtained operations belonging to the upper-hierarchy execute in parallel with the function belonging to the lower-hierarchy within the range of the first clock cycles and the second clock cycles while maintaining the hierarchical structure of the behavioral descriptions;

a circuit element allocator configured to allocate each behavioral operation already scheduled of the data-flow graph to each circuit element of the logic circuit; and an RTL description generator configured to high-level synthesizing based on an allocation result of the circuit elements and to generate register transfer level descriptions.

* * * * *